(12) United States Patent
Shibata et al.

(10) Patent No.: US 6,259,186 B1
(45) Date of Patent: Jul. 10, 2001

(54) SURFACE ACOUSTIC WAVE FUNCTIONAL WAVE

(75) Inventors: Yoshihiko Shibata; Naohiro Kuze, both of Shizuoka (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/453,832

(22) Filed: Dec. 2, 1999

Related U.S. Application Data

(63) Continuation of application No. PCT/JP98/02436, filed on Jun. 2, 1998.

(30) Foreign Application Priority Data

Jun. 2, 1997 (JP) .................................................... 9-143838

(51) Int. Cl.$^7$ ................................................. H01L 41/04
(52) U.S. Cl. ......................................................... 310/313 A
(58) Field of Search ........................... 310/313 A, 313 R, 310/360

(56) References Cited

FOREIGN PATENT DOCUMENTS

| | | |
|---|---|---|
| 53-88197 | 8/1978 | (JP) . |
| 57-44202 | 9/1982 | (JP) . |
| 4-109709 | 4/1992 | (JP) . |
| 5-90892 | 4/1993 | (JP) . |
| 5-267196 | 10/1993 | (JP) . |
| 5-267197 | 10/1993 | (JP) . |
| 5-319993 | 12/1993 | (JP) . |
| 6-56592 | 3/1994 | (JP) . |
| 6-56593 | 3/1994 | (JP) . |
| 8-139565 | 5/1996 | (JP) . |
| 8-250966 | 9/1996 | (JP) . |

OTHER PUBLICATIONS

Y. Shibata et al., "Surface Acoustic Wave Properties of Lithium Tantalate Films Grown by Pulsed Laser Deposition," Japanese Journal of Applied Physics, vol. 34, pp. 249–253 (1995).

(List continued on next page.)

Primary Examiner—Mark O. Budd
(74) Attorney, Agent, or Firm—Finnegan, Henderson, Farabow, Garrett & Dunner, L.L.P.

(57) ABSTRACT

A surface acoustic wave element includes a $LiNb_xTa_{1-x}O_3$ ('x' is 0 or more and 1 or less) film on a (012) sapphire substrate, in which a Love wave is propagated as a surface acoustic wave in a specific direction of the $LiNb_xTa_{1-x}O_3$ film. Preferably, a crystal axis of the sapphire substrate and a crystal axis of a (012) $LiNb_xTa_{1-x}O_3$ film ('x' is 0 or more and 1 or less) are parallel to each other; a surface acoustic wave propagation direction is within a range of ±20 degrees around an axis vertical to a C-axis projection line direction of a crystal axis of the sapphire substrate or the (012) $LiNb_xTa_{1-x}O_3$ film. Alternatively, a C-axis projection line direction of a crystal axis of the sapphire substrate and a C-axis direction of a crystal axis of a (100) $LiNb_xTa_{1-x}O_3$ film ('x' is 0 or more and 1 or less) are parallel to each other, and the surface acoustic wave propagation direction is within a range of ±35 degrees around an axis vertical to a C-axis projection line direction of a crystal axis of the sapphire substrate. A piezoelectric substrate preferably has an intermediate layer including of a metal or a metal oxide between the sapphire substrate and the (100) $LiNb_xTa_{1-x}O_3$ ('x' is 0 or more and 1 or less).

15 Claims, 23 Drawing Sheets

OTHER PUBLICATIONS

Y. Shibata et al., "Epitaxial Growth and Surface Acoustic Wave Properties of Lithium Niobate Films Grown by Pulsed Laser Depositon," Journal of Applied Physics, vol. 77, pp. 1498–1503 (1995).

T. Mitsuyu et al., "Structures and SAW Properties of Rf–Sputtered Single–Crystal Films of ZnO on Sapphire," Journal of Applied Physics, vol. 51, pp. 2464–2470 (1980).

N. Fujimura et al., "$LiNbO_3$ Film With a New Epitaxial Orientation on R–Cut Sapphire," Journal of Applied Physics, vol. 75, pp. 2169–2176 (1994).

T. Hirai et al., "Crystal and Electrical Characterizations of Epitaxial $Ce_xZr_{1-x}O_2$ Buffer Layer For The Metal/Ferroelectric/Insulator/Semiconductor Field Effect Transistor," Japanese Journal of Applied Physics, vol. 35, pp. 5150–5153 (1996).

"Surface Acoustic Wave Engineering," The Institute of Electronics Information and Communication Engineers, pp. 124–128.

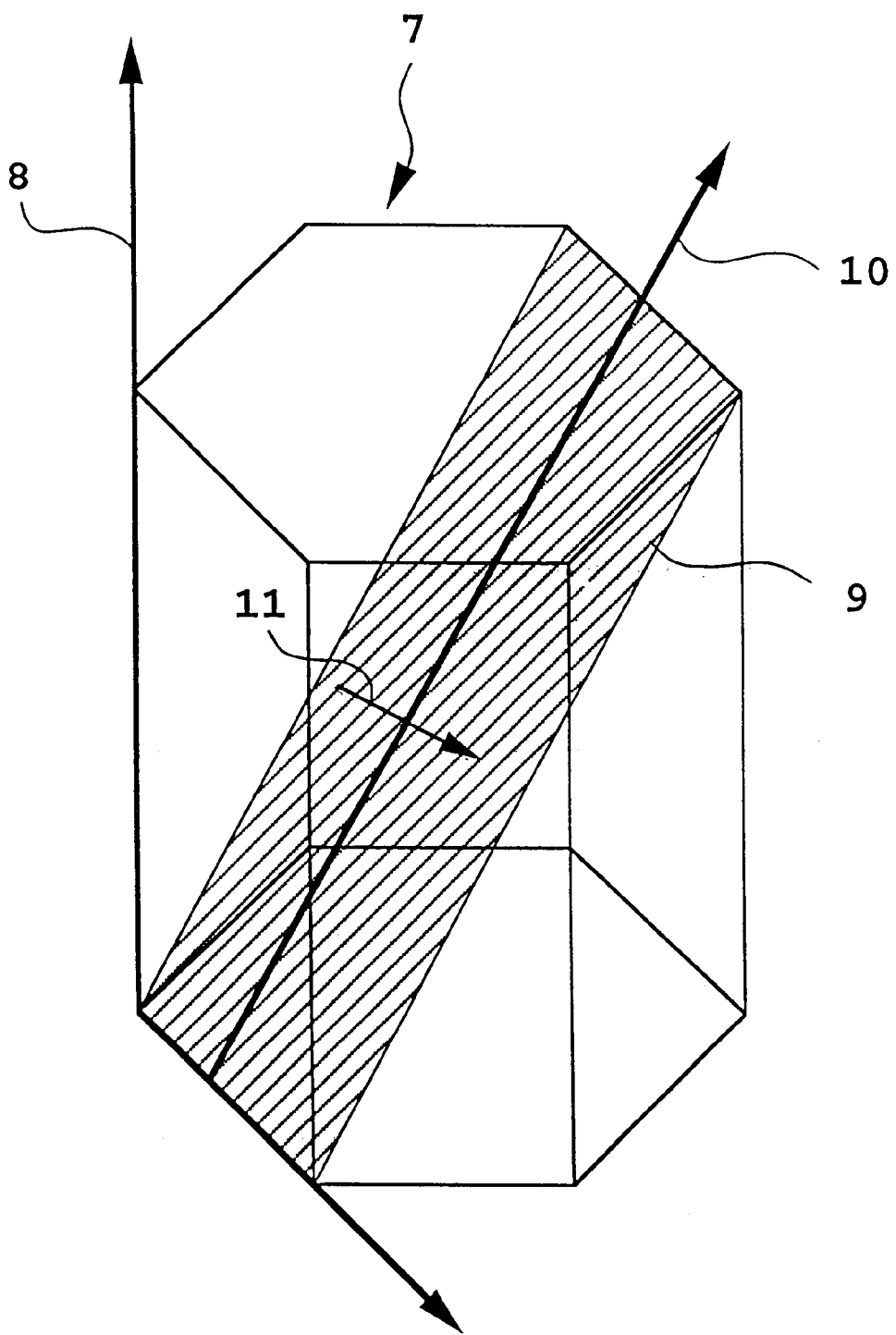
F I G. 2

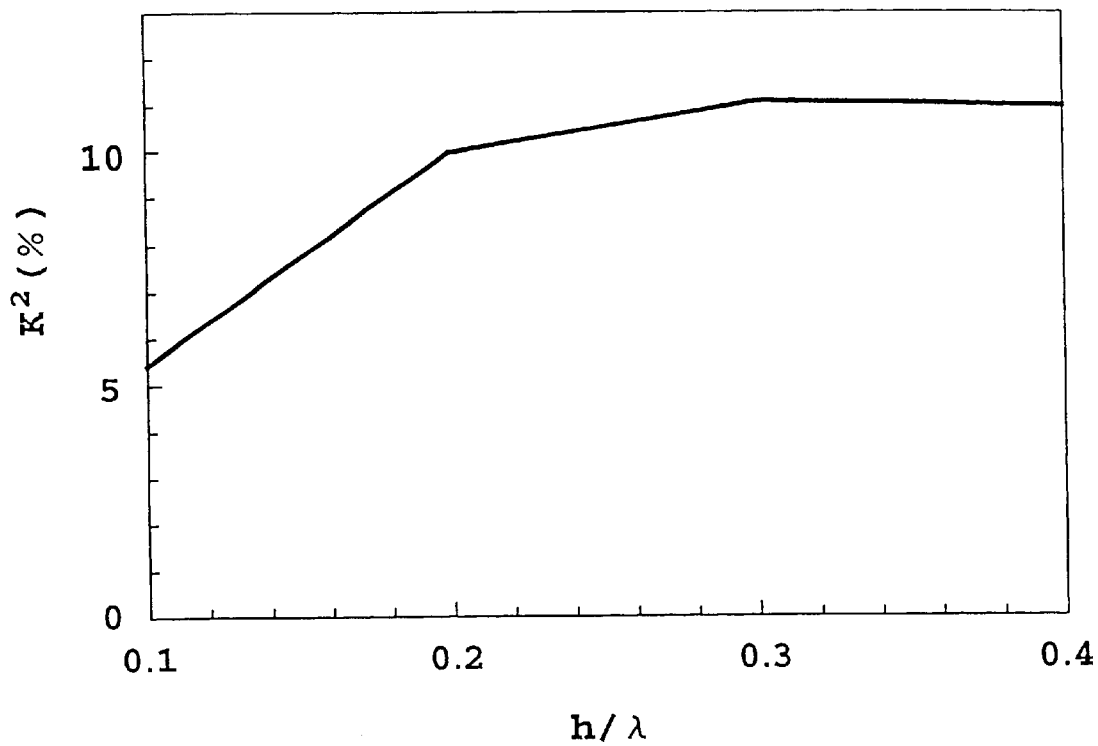
F I G. 10

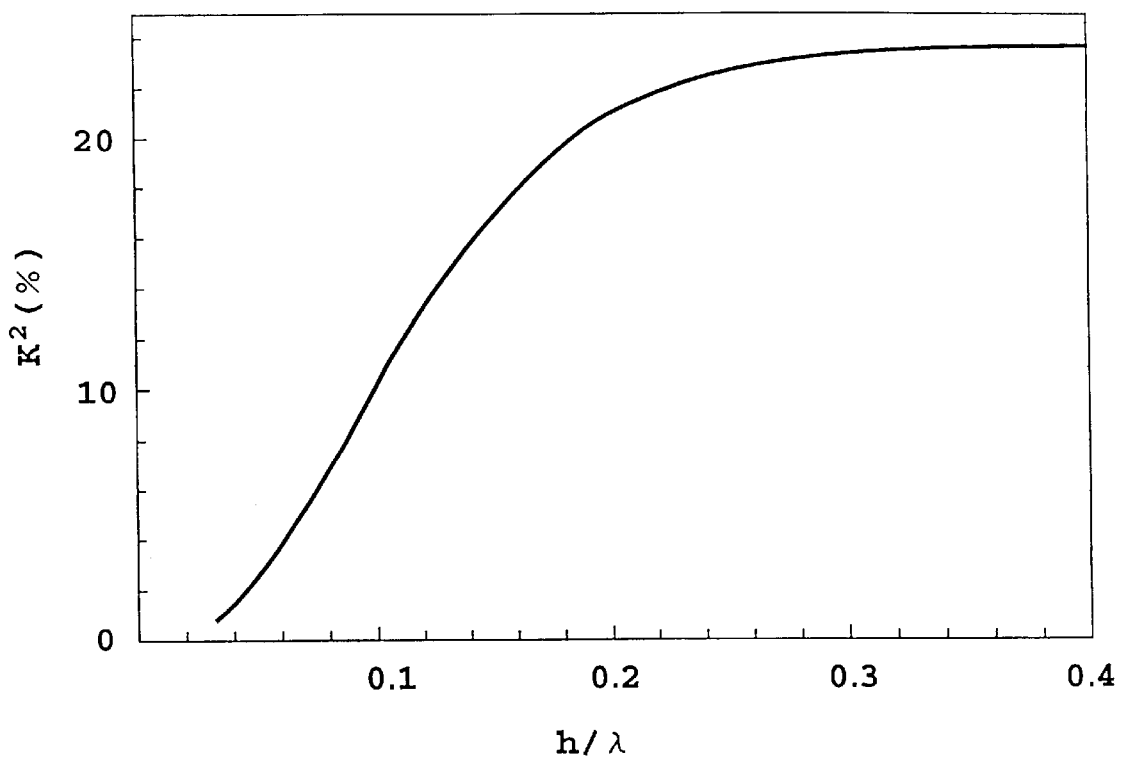
F I G. 12

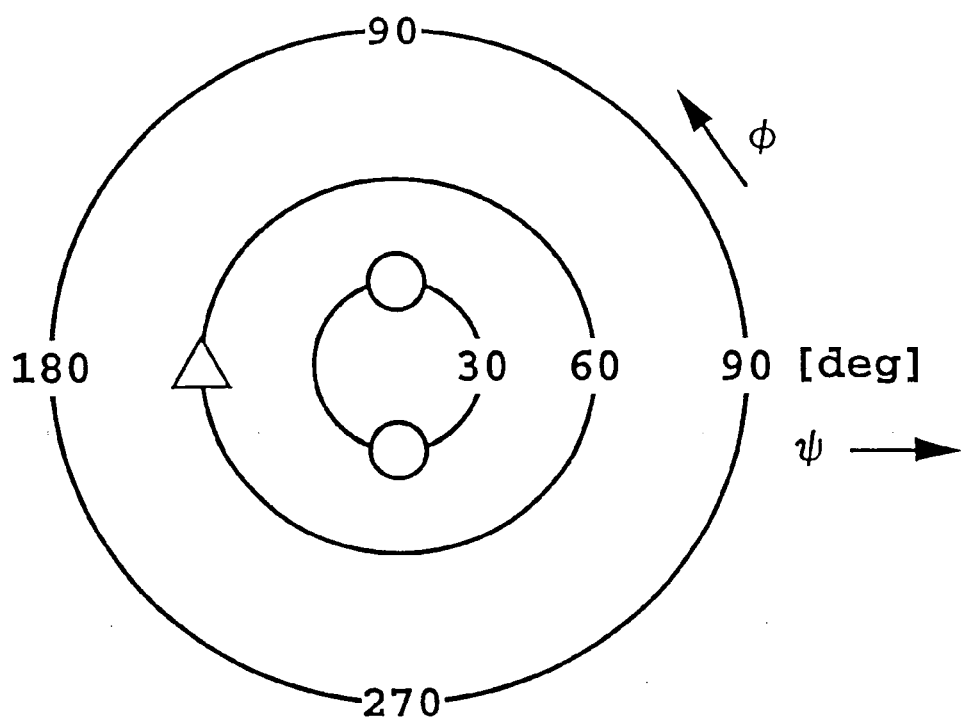
○ : {110} LiNbO$_3$, $\psi=30°$, $2\theta=34.8°$
△ : {006} SAPPHIRE, $\psi=57.61°$, $2\theta=41.7°$
*F I G. 13*

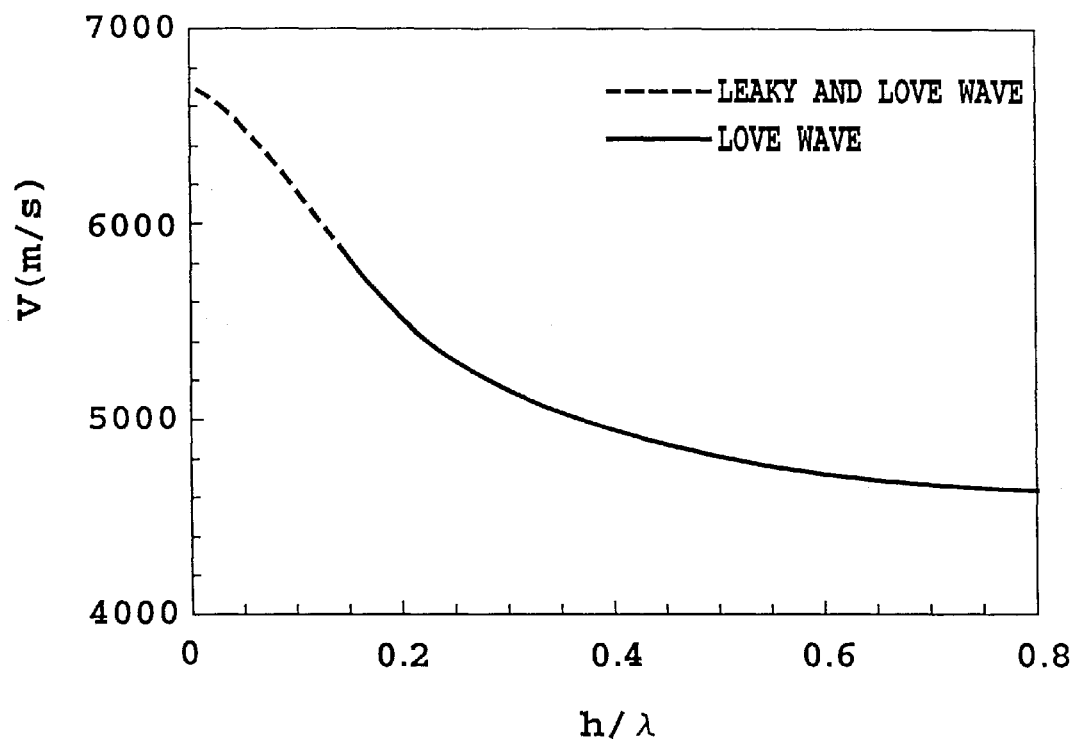
F I G. 14

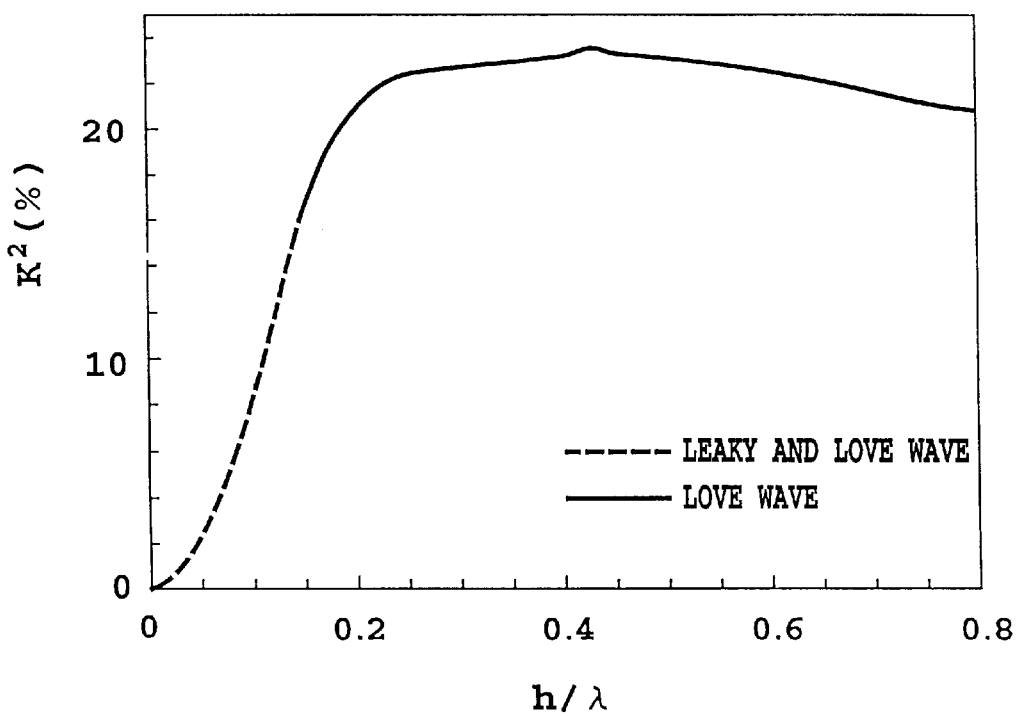
F I G. 15

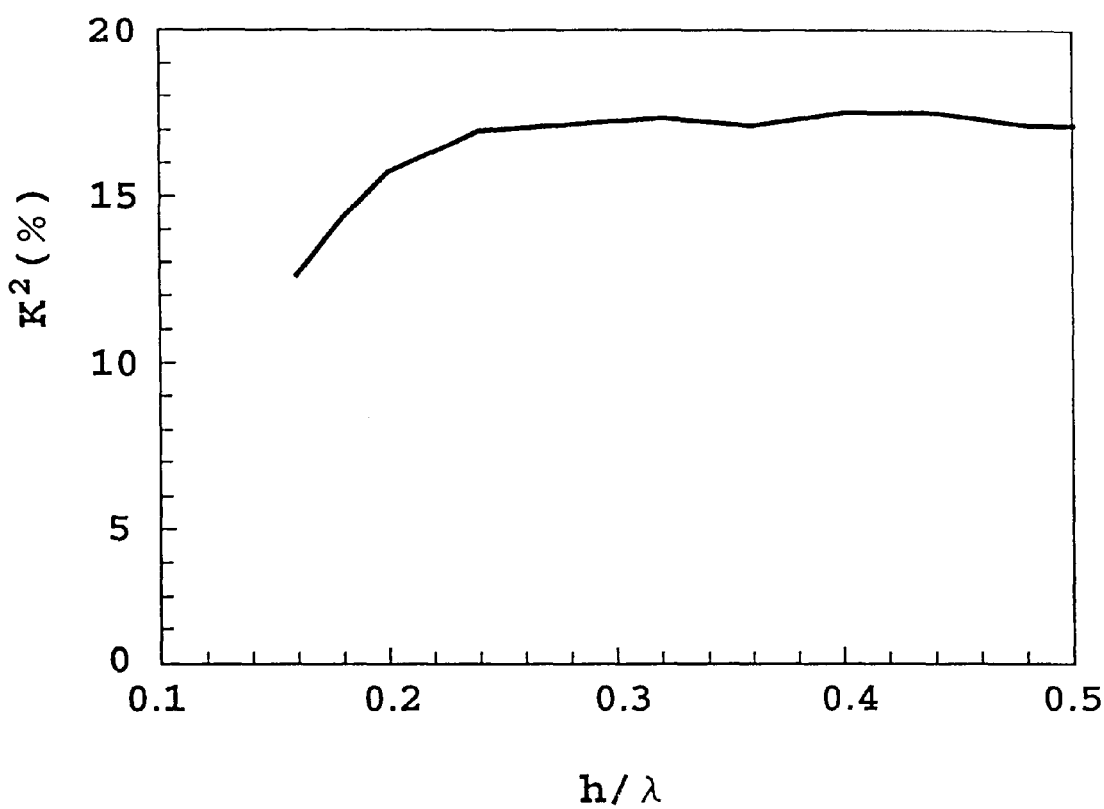
F I G. 20

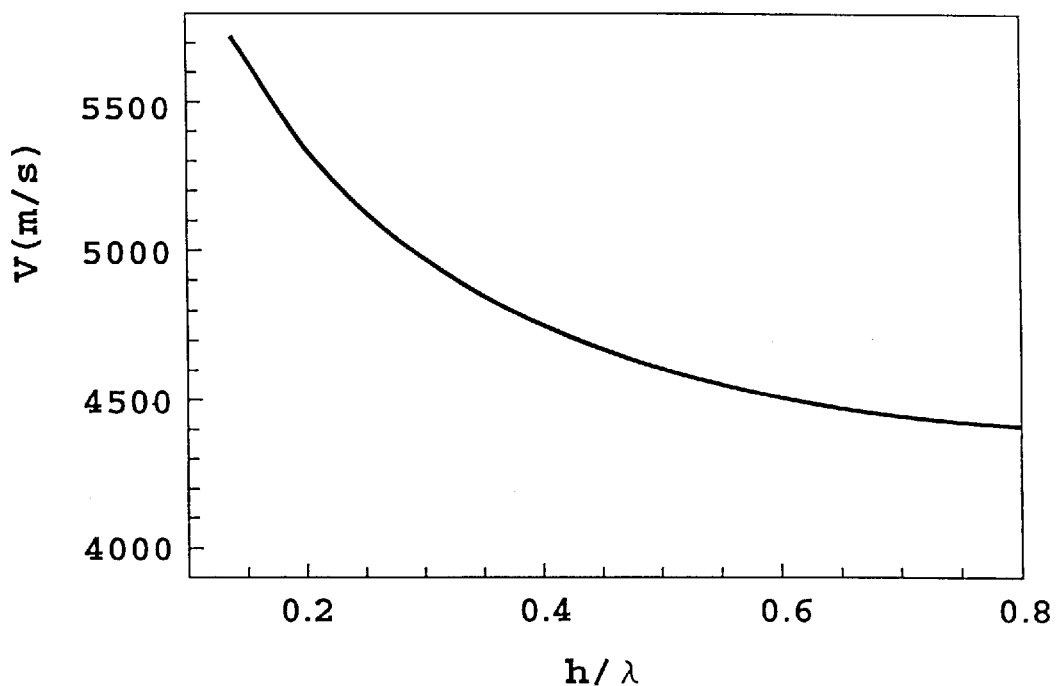
*F I G. 21*

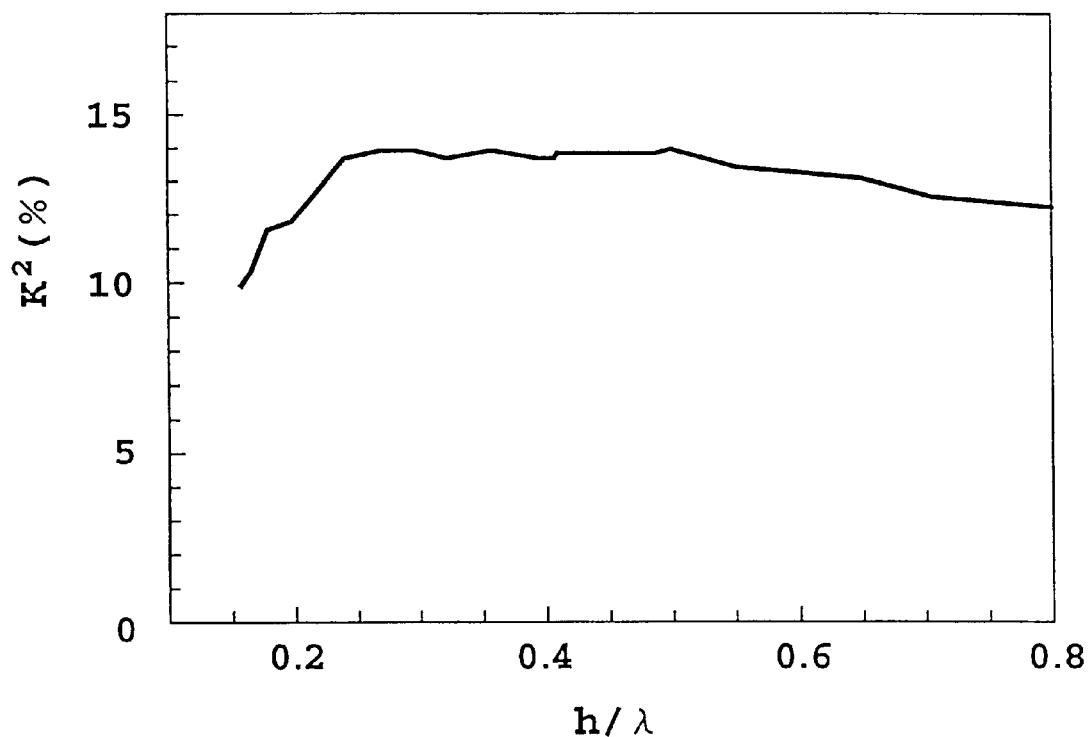
*F I G. 22*

SURFACE ACOUSTIC WAVE FUNCTIONAL WAVE

This application is based on Patent Application No. 9-143838 (1997) filed on Jun. 2, 1997 in Japan, the content of which is incorporated hereinto by reference. In addition, this application is a continuation application of International Application No. PCT/JP98/02436 filed Jun. 2, 1998 the content of which is incorporated herein by reference.

BACKGROUND OF THE INVENTION

1. Field of the Invention

The present invention relates to a surface acoustic wave functional element, and moreover to a suitable thin film piezoelectric substrate thereto and a manufacturing method thereof. The surface acoustic wave functional element is a device utilizing a surface acoustic wave, and includes a filter, a resonator, a convolver or the like.

2. Description of Related Art $LiTaO_3$ and $LiNbO_3$ have very superior properties in electromechanical coupling coefficient, electro-optical effect, non-linear optical effect or the like, and are practically used as a material for a surface acoustic wave (SAW) device. $LiTaO_3$ and $LiNbO_3$ have substantially equal material properties including crystal structure, lattice constant, thermal expansion coefficient or the like. A material represented by $LiNb_xTa_{1-x}O_3$ ('x' is 0 or more and 1 or less) exhibits material properties similar to $LiTaO_3$ and $LiNbO_3$.

An elastic wave is divided into a bulk wave and a surface acoustic wave. The bulk wave includes longitudinal and shear waves. The surface acoustic wave includes a Rayleigh wave, a Love wave, a Sezawa wave, a pseudo surface acoustic wave or the like. The pseudo surface acoustic wave has a propagation loss. The Rayleigh wave, Love wave, and Sezawa wave do not have such propagation loss. The Love wave is a wave mainly composed of a displacement component vertical to a propagation direction and parallel to a substrate surface. The Rayleigh wave and Sezawa wave are waves that have a less displacement of which the Love wave is mainly composed; and that are mainly composed of a displacement component in a propagation direction, or a depth direction to a substrate surface, respectively. Because the Love wave has shear-wave oriented properties as described above, it has a small propagation loss in a solution. Thus, an application to a surface acoustic wave sensor in the solution or the like is expected.

In creating a high-frequency wide-bandwidth SAW filter, it is preferable to employ a wave having a high surface acoustic wave velocity (V) and a large electromechanical coupling coefficient ($K^2$) and being free of a propagation loss. In a commercially available single crystal material, V=4000 m/s and $K^2$=5.5% are achieved with 128Y $LiNbO_3$ in a Rayleigh wave which is free of a propagation loss. For use of an SAW device such as SAW filter, assuming that a surface acoustic wave velocity is V and a wavelength of the surface acoustic wave is $\lambda$, a use frequency is represented by f=V/$\lambda$. Hence, in employing SAW filter in a high-frequency band, the low surface acoustic wave velocity results in reduced $\lambda$. A pitch of a electrode of interdigital transducer is generally $\lambda/4$ or less. When $\lambda$ is reduced, it becomes difficult to carry out an electrode fabrication process using lithography; and therefore, a material having higher V is desired. A technique for improving V includes a method for forming a thin film of $LiNbO_3$, $LiTaO_3$, ZnO or the like on a sapphire substrate having a high V and using it, which is practically used with a ZnO thin film. However, the ZnO thin film, has such is a disadvantage that $K^2$ is small, i.e., not greater than 5%. A material having high $K^2$ is required to form a filter with a wide bandwidth. In order to obtain a piezoelectric substrate material having high V together with large $K^2$, there is a growing need for making a thin film of $LiTaO_3$ and $LiNbO_3$ having higher V and larger $K^2$ than ZnO, and a variety of studies have been made. The inventors have succeeded in making a thin film of piezoelectric (012) $LiTaO_3$ on a (012) sapphire substrate and (001) $LiNbO_3$ on a (001) sapphire substrate using a laser abrasion method, and has reported that its SAW velocity is significantly higher than that of a bulk material, and this material can be advantageously employed as a material for high frequency. However, the electromechanical coupling coefficients are obtained by theoretical calculation less than 5% for the $LiTaO_3$ film (Y. Shibata et al., Jpn. J. Appl. Phys., 34 (1995) 249–253.) and less than 6.9% for the $LiNbO_3$ film (Y. Shibata et al., J. Appl. Phys., 77 (1995) 1489–1503), so their use has been limited.

In a two-layer structure of a substrate and a piezoelectric film, it is known that when a velocity of the longitudinal wave in the substrate is greater than that in a bulk single crystal of a piezoelectric film material, the Sezawa wave or Love wave appears (Y. Shibata et al., Jpn. J. Appl. Phys., 34 (1995) 249–253, T. Mitsuyu et al., J. Appl. Phys., 51 (1980) 2464–2470, etc.). However, a surface acoustic wave functional element employing a Love wave or a Sezawa wave with a large electromechanical coupling coefficient and a high surface acoustic wave velocity is not practically used expect in a case that $K^2$ is about 4.3% or less at the Sezawa wave in the ZnO film.

Therefore, an object of the present invention is to achieve high V together with large $K^2$ for a wave free of a propagation loss with a $LiNb_xTa_{1-x}O_3$ film. In particular, another object of the present invention is to generate a Love wave having a high surface acoustic wave velocity and a large electromechanical coupling coefficient.

SUMMARY OF THE INVENTION

To solve the aforementioned problems, as a result of through investigation by the inventors, the inventors found out that a propagation direction of a surface acoustic wave was controlled at a $LiNb_xTa_{1-x}O_3$ ('x' denotes 0 or more and 1 or less) film on a (012) sapphire within a specific range, making it possible to employ a Love wave, and to provide superior properties including a high surface acoustic wave velocity and a large electromechanical coupling coefficient, and achieved the present invention.

1) In the first embodiment of the present invention, surface acoustic wave functional element comprises a (012) sapphire substrate and a $LiNb_xTa_{1-x}O_3$ on said (012) sapphire substrate ('x' is 0 or more and 1 or less), wherein the $LiNb_xTa_{1-x}O_3$ film is a (012) $LiNb_xTa_{1-x}O_3$ ('x' is 0 or more and 1 or less), a crystal axis of said sapphire substrate and a crystal axis of said (012) $LiNb_xTa_{1-x}O_3$ film are parallel to each other, a Love wave is propagated as a surface acoustic wave, and a propagation direction of said surface acoustic wave is within a range of ±15 degrees around an axis vertical to the C-axis projection line direction of the crystal axis of said sapphire substrate or said (012) $LiNb_xTa_{1-x}O_3$ film.

2) In the surface acoustic wave functional element set forth in the above 1), h/$\lambda$ may be 0.05 or more and 0.7 or less, where film thickness of said $LiNb_xTa_{1-x}O_3$ film is 'h', and a wavelength of a surface acoustic wave is $\lambda$.

3) In the surface acoustic wave functional element set forth in the above 1) or 2), said (012) $LiNb_xTa_{1-x}O_3$ film may be a (012) $LiTaO_3$ film.

4) In the surface acoustic wave functional element set forth in any of the above 1) to 3), said (012) $LiNb_xTa_{1-x}O_3$ film may be a (012) $LiNbO_3$ film 5) In the second embodiment of the present invention, A surface acoustic wave functional element comprises a (012) sapphire substrate and a $LiNb_xTa_{1-x}O_3$ film ('x' is 0 or more and 1 or less) on said (012) sapphire substrate, wherein said $LiNb_xTa_{1-x}O_3$ film is (100) $LiNb_xTa_{1-x}O_3$ ('x' is 0 or more and 1 or less); a C-axis projection line direction of a crystal axis of said sapphire substrate and a C-axis direction of a crystal axis of said (100) $LiNb_xTa_{1-x}O_3$ film are parallel to each other; a surface acoustic wave propagation direction is within a range of ±20 degrees around an axis vertical to the C-axis projection line direction of the crystal axis of said sapphire substrate.

6) In the surface acoustic wave element set forth in the above 5), $h/\lambda$ may be 0.01 or more and 2 or less, where film thickness of said $LiNb_xTa_{1-x}O_3$ film is 'h', and a wavelength of a surface acoustic wave is $\lambda$.

7) In the surface acoustic wave functional element set forth in the above 5) or 6), said (100) $LiNb_xTa_{1-x}O_3$ film may be a (100) $LiTaO_3$ film.

8) In the surface acoustic functional element set forth in any of the above 5) and 6), said (100) $LiNb_xTa_{1-x}O_3$ film may be a (100) $LiNbO_3$ film.

9) In the surface acoustic wave functional element set forth in the above 1) or 5), an electromechanical coupling coefficient may be 8% or more.

10) In the third embodiment of the present invention, a piezoelectric substrate useful for a surface acoustic wave functional element comprises a (012) sapphire substrate and a (100) $LiNb_xta_{1-x}O_3$ film on said (012) sapphire substrate, wherein a C-axis projection line direction of a crystal axis of said sapphire substrate and a C-axis direction of a crystal axis of said (100) $LiNb_xTa_{1-x}O_3$ film are parallel to each other.

11) In the piezoelectric substrate set forth in the above 10), said piezoelectric substrate may further comprise an intermediate layer comprised of a metal oxide between said sapphire substrate and said (100) $LiNb_xTa_{1-x}O_3$ film, wherein said intermediate layer is present throughout a surface acoustic wave propagation area.

12) In the piezoelectric substrate set forth in the above 11), a thickness of said intermediate layer may be 0.1 nm or more and 10 nm or less.

13) In the piezoelectric substrate set forth in the above 11), said intermediate layer may comprise at least one selected from a group consisting of oxide of niobium, tantalum, and aluminum.

14) In the piezoelectric substrate set forth in any of the above 10) to 13), said (100) $LiNb_xTa_{1-x}O_3$ film may be a $LiNbO_3$ film.

15) In the piezoelectric substrate set forth in the above 10), an electromechanical coupling coefficient may be preferably 8% or more.

16) In the fourth embodiment of the present invention, A method for manufacturing piezoelectric substrate, comprises the steps of:forming an intermediate layer on a (012) sapphire substrate using a metal or a metal oxide; and forming a (100) $LiNb_xTa_{1-x}O_3$ film ('x' is 0 or more and 1 or less) on the intermediate layer so that a C-axis projection line direction of a crystal axis of said sapphire substrate and a C-axis direction of a crystal axis of said (100) $LiNb_xTa_{1-x}O_3$ film are parallel to each other.

17) In the piezoelectric substrate manufacturing method set forth in the above 16), a thickness of said intermediate layer may be 0.1 nm or more and 10 nm or less.

18) In the piezoelectric substrate manufacturing method set forth in the above 16), said metal or metal oxide may comprise at least one selected from a group consisting of niobium, tantalum, aluminum, and oxides thereof.

19) In the piezoelectric substrate set forth in any of the above 16) to 18), said (100) $LiNb_xTa_{1-x}O_3$ film may be a (100) $LiNbO_3$ film.

BRIEF DESCRIPTION OF THE DRAWINGS

FIG. 2 is a schematic view for illustrating a interrelationship among a C-axis direction of a crystal axis of a sapphire substrate, a C-axis projection line direction, an axial direction vertical to the C-axis projection line direction, and a (012) face;

FIG. 10 is a graph depicting the measurement results of an electromechanical coupling coefficient of the surface acoustic wave functional element according to Example 2;

FIG. 12 is a graph depicting the measurement results of an electromechanical coupling coefficient of the surface acoustic wave functional element according to Example 3;

FIG. 13 is a schematic view showing the analysis results of an X-ray pole figure of a film structure of a surface acoustic wave functional element according to Example 4;

FIG. 14 is a graph depicting the measurement results of a surface acoustic wave velocity of the surface acoustic wave functional element according to Example 4;

FIG. 15 is a graph depicting the measurement results of an electromechanical coupling coefficient of the surface acoustic wave functional element according to Example 4;

FIG. 20 is a graph depicting the measurement results of an electromechanical coupling coefficient of the surface acoustic wave functional element according to Example 6;

FIG. 21 is a graph depicting the measurement results of a surface acoustic wave velocity of a surface acoustic wave functional element according to Example 7;

FIG. 22 is a graph depicting the measurement results of an electromechanical coupling coefficient of the surface acoustic wave functional element according to Example 7;

BEST MODE FOR CARRYING OUT THE INVENTION

Figure 1:
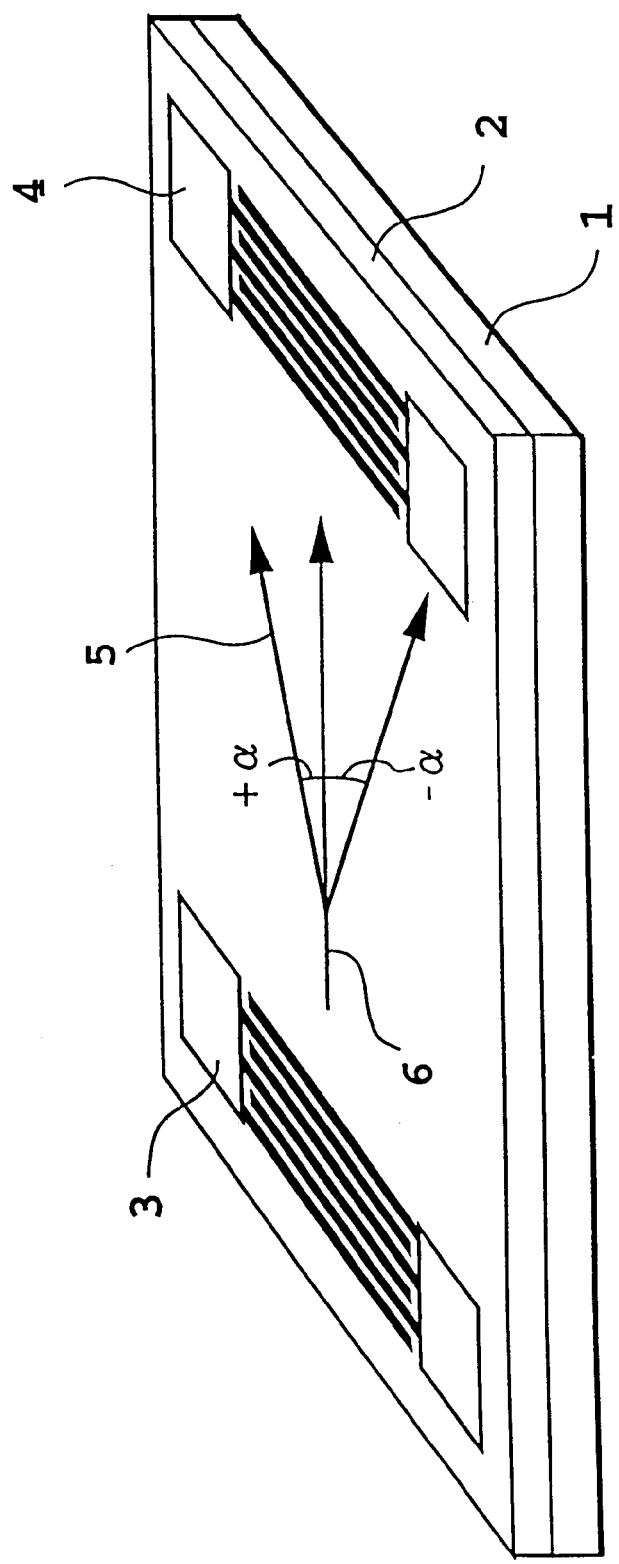
FIG. 1 is a schematic perspective view showing a structure of a surface acoustic wave functional element.

In order to achieve a great surface acoustic wave velocity and a great electromechanical coupling coefficient, it is considered effective to employ a Sezawa wave or a Love wave. In particular, in the Love wave, the wave converges in a piezoelectric thin film and propagates, which is free of a propagation loss and which is advantageous. However, conventionally, as an example in which an attempt for practically using these has been succeeded is not known except in a case that $K^2$ is about 4.3% or less for the Sezawa wave on the ZnO film.

In a two-layer structure of a substrate and a piezoelectric film, it is known when a velocity of a longitudinal wave in the substrate is greater than that in a bulk single crystal of a piezoelectric film material, that the Sezawa wave or the Love wave appear (Y. Shibata et al., Jpn. J. Appl. Phys., 34 (1995) 249–253, T. Mitsuyu et al., J. Appl. Phys., 51 (1980) 2464–2470 or the like). However, it is true that a Sezawa wave or Love wave having a large electromechanical coupling coefficient is not always obtained when the above condition is met. Sometimes, an electromechanical coupling coefficient may be small or such Sezawa wave or Love wave itself cannot be obtained. Therefore, it is important and indispensable to find out a condition in which the Love wave or Sezawa wave having large electromechanical coupling coefficient and high surface acoustic wave velocity can be obtained in order to ensure its practical use.

Conventionally, there has been no example in which the Love wave observed in the present invention can be obtained in a (012) $LiNb_xTa_{1-x}O_3$ film or a (100) $LiNb_xTa_{1-x}O_3$ film on a (012) sapphire substrate. The Love wave was realized only after controlling the surface acoustic wave propagation direction and epitaxial direction control according to the present invention, and use of the Love wave was made possible.

With respect to the (012) $LiNb_xTa_{1-x}O_3$ film on the (012) sapphire substrate, the materials themselves are publicly known, but only discussion of the surface acoustic wave propagation in the C-axis propagation line direction has been made. In contrast, in the present invention, the surface acoustic wave propagation direction is inverted by 90 degrees from the C-axis projection direction that is a conventional direction, thereby making it possible to first obtain a great electromechanical coupling coefficient. This is an unexpected effect, contrary to a conventional technical knowledge. Namely, it is known that in general, a great electromechanical coupling coefficient can be obtained by propagating the surface acoustic wave in a polarization axis direction of a piezoelectric body, or in the projection line direction of the polarization axis when a polarization axis is not present in plane. Here, the polarization axis denotes a direction in which spontaneous polarization occurs. For example, in $LiNbO_3$ or $LiTaO_3$, it denotes a C-axis direction ([001] direction). It is known that, for example, in an example of a bulk $LiNbO_3$ single crystal with a Y-cut (100) face, during Z propagation that is in a polarization axis direction ([001] direction propagation), an electromechanical coupling coefficient is 4.82%, but during X propagation that is in a direction vertical to the polarization axis ([100] direction propagation), the coefficient is 1.57% which is about ⅓ of that in the polarization axis direction. With such technical common sense, also in the (012) $LiNb_xTa_{1-x}O_3$ film, conventionally, only surface acoustic wave propagation in the C-axis projection line direction has been studied; and however, in the present invention, the inventor dares to adopt a direction in which a large electromechanical coupling coefficient can be hardly obtained based on common sense, thereby making it possible to generate the Love wave.

In addition, $LiTaO_3$ and $LiNbO_3$ have very similar properties, and provide specific crystal structures which is a $LiNbO_3$ ferroelectric structure. A lattice constant and a thermal expansion coefficient as well as the crystal structure, are substantially equal. Moreover, $LiTaO_3$ and $LiNbO_3$ are generally can be a series of compounds that can be expressed by the form of $LiNb_xTa_{1-x}O_3$ (x is 0 or more and 1 or less) including $LiTaO_3$ and $LiNbO_3$.

With respect to the (100) $LiNb_xTa_{1-x}O_3$ film on the (012) sapphire substrate, conventionally, there has been obtained a film in which the C-axis projection line direction of the sapphire substrate and the C-axis direction of the (100) $LiNb_xTa_{1-x}O_3$ film are vertical to each other. However, according to the present invention, there is obtained a novel piezoelectric substrate in which the C-axis projection line direction of the sapphire substrate and the C-axis direction of the (100) $LiNb_xTa_{1-x}O_3$ film are parallel to each other. The surface acoustic wave propagation direction is controlled on the film within a certain range, thereby making it possible to practically use the Love wave with a large electromechanical coupling coefficient.

The present invention will be described in more detail with reference to the accompanying drawings.

FIG. 1 is a schematic perspective view showing a structure of a surface acoustic wave functional element. In FIG. 1, reference numeral 1 designates a (012) sapphire substrate; reference numeral 2 designates a $LiNb_xTa_{1-x}O_3$ film; reference numeral 3 designates an input electrode; reference numeral 4 designates an output electrode; reference numeral 5 designates a reference direction of a crystal axis of a $LiNb_xTa_{1-x}O_3$ film; and reference numeral 6 designates a propagation direction of a surface acoustic wave (SAW). Here, the reference direction designates a direction vertical to the C-axis projection line direction of a crystal axis of the (012) sapphire substrate or (012) $LiNb_xTa_{1-x}O_3$ film where the $LiNb_xTa_{1-x}O_3$ film is a (012) $LiNb_xTa_{1-x}O_3$ film; or it denotes a direction vertical to the C-axis projection line direction of the crystal axis of the (012) sapphire substrate where the $LiNb_xTa_{1-x}O_3$ film is a (100) $LiNb_xTa_{1-x}O_3$ film.

Figure 3:
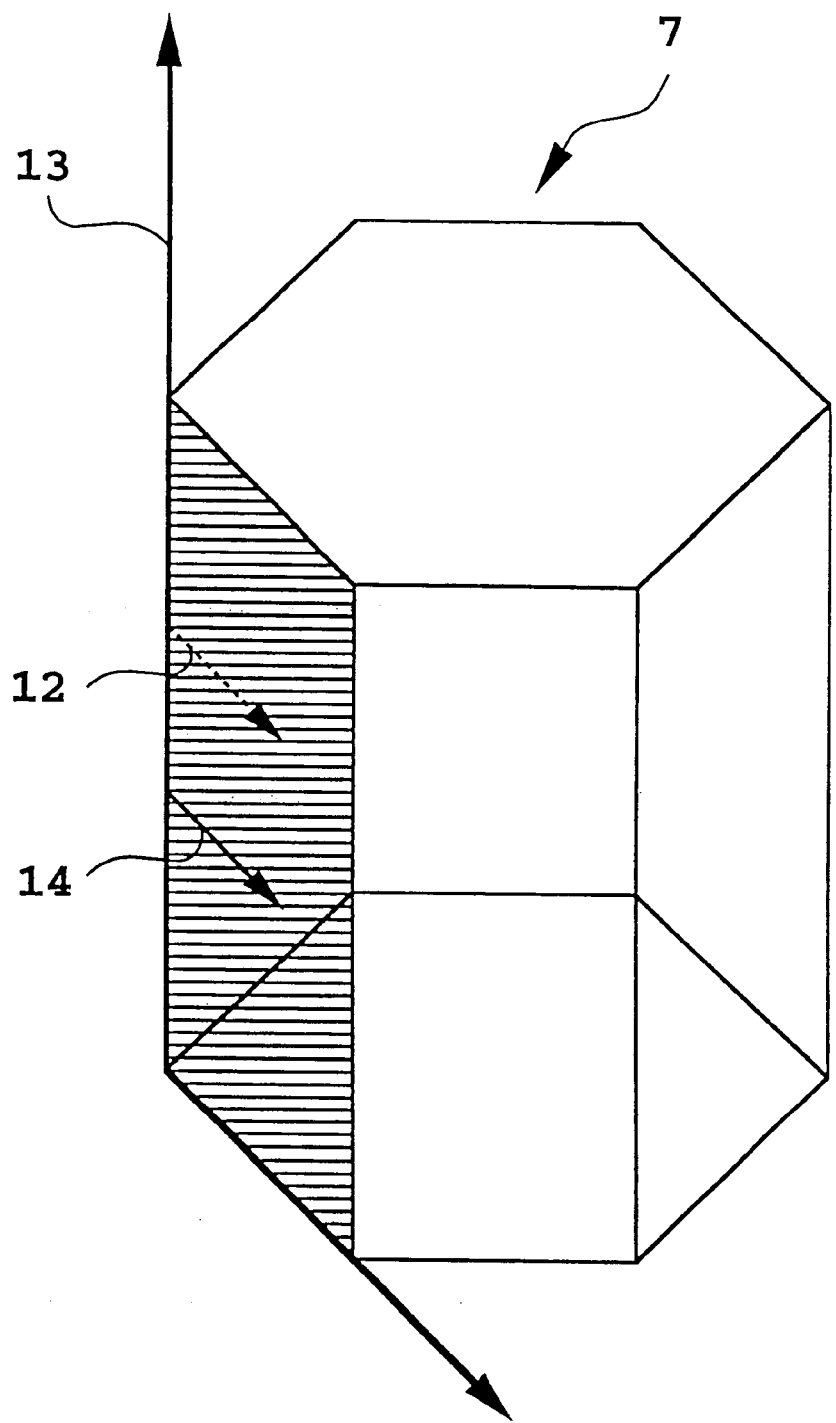
FIG. 3 is a schematic view for illustrating a relationship between the C-axis direction of the crystal axis of the sapphire substrate and a (100) face.

FIG. 2 is a schematic view for illustrating an interrelationship among the C-axis direction of the crystal axis, C-axis projection line direction of the crystal axis, direction of axis vertical to the C-axis projection line direction, and (012) face (also referred to as an R face) of a sapphire substrate. In sapphire, an axis 8 of a hexagonal columnar crystal 7 indicates a C-axis direction. When the axis 8 is projected on a (012) face (R face) 9, a C-axis projection line 10 is obtained, and an axis 11 indicates the direction of an axis vertical to the C-axis projection line 10 in the (012) face of a sapphire substrate. On the other hand, FIG. 3 is a schematic view for illustrating a relationship between the C-axis direction of the crystal axis of the sapphire substrate and the (100) face (also referred to as an M face). An axis 13 contained in a (100) face 12 of a hexagonal columnar crystal 7 of sapphire is parallel to a C-axis, and indicates a C-axis direction. Reference numeral 14 designates an axis vertical to the C-axis direction.

Figure 4:
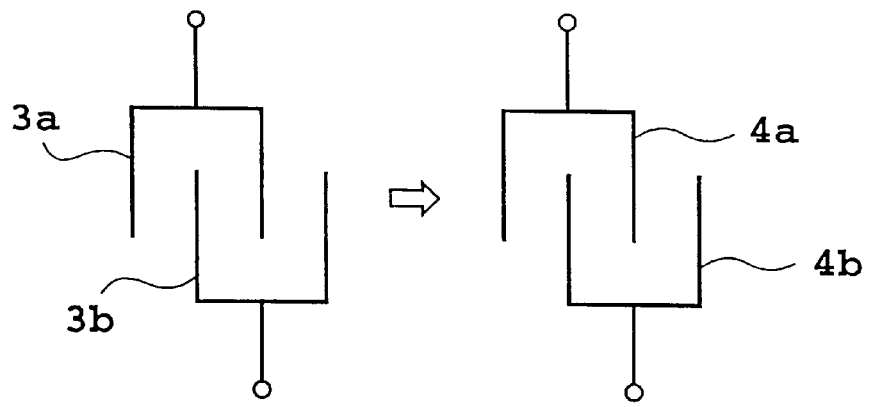
FIG. 4 is an illustrative view showing a relative position relationship between an input transducer and an output transducer.
Figure 5:
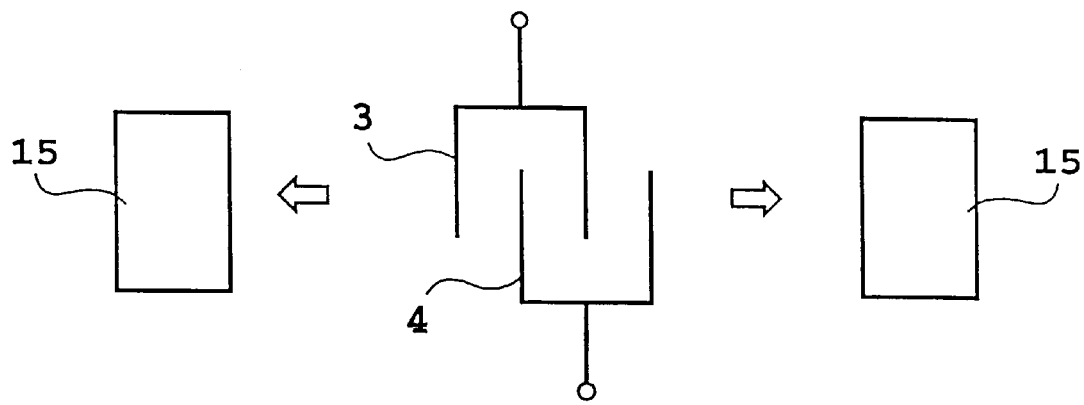
FIG. 5 is an illustrative view showing a relative position relationship between an input transducer and an output transducer.

A surface acoustic wave propagation direction (reference numeral 6 of FIG. 1) is a direction from an input electrode 3 to an output electrode 4. FIG. 4 and FIG. 5 are illustrative views showing a relative positional relationship between the input electrode 3 and the output electrode 4. For example, a propagation direction is a direction from interdigital transducers 3a and 3b as an input electrodes 3 toward interdigital transducers 4a and 4b as output electrodes in the electrode arrangement shown in FIG. 4, and is a direction from interdigital transducers 3 and 4 as an input/output electrode to a reflector 15 in an electrode arrangement shown in FIG. 5.

In the (012) $LiNb_xTa_{1-x}O_3$ film ('x' is 0 or more and 1 or less) on a sapphire substrate, a surface acoustic wave propagation direction is controlled within the above mentioned specific range, thereby making it possible to utilize the Love wave, and making it possible to generate a wave having a high surface acoustic surface wave velocity (4400 m/s or more) and a large electromechanical coupling coefficient (at most about 24%).

A wave having a high surface acoustic wave velocity and a large electromechanical coupling coefficient generated in the present invention is a Love wave. Conventionally, in the (012) $LiNb_xTa_{1-x}O_3$ film on the (012) sapphire substrate, there has been no example in which a Love wave observed in the present invention was obtained. The Love wave is realized only after controlling the surface acoustic wave propagation direction according to the present invention, and thereby use of the Love wave is made possible.

As a method for synthesizing the (012) $LiNb_xTa_{1-x}O_3$ film, any method capable of forming a piezoelectric film may be employed without being limited thereto.

The surface acoustic wave propagation direction in the (012) $LiNb_xTa_{1-x}O_3$ film is required to be within a range of ±20 degrees, preferably within a range of ±15 degrees, and more preferably within a range of ±5 degrees around an axis ([2-1-1] axis) vertical to the C-axis projection line direction of the sapphire substrate. That is, an absolute value of an angle |α| formed between a reference direction 5 and a SAW propagation direction 6 shown in FIG. 1 is less than or equal to 20 degrees, is preferably less than or equal to 15 degrees, and more preferably less than or equal to 5 degrees.

When the film thickness of the (012) $LiNb_xTa_{1-x}O_3$ film is 'h', and a wavelength of the surface acoustic wave is λ, h/λ is generally 0.05 or more and 0.7 or less, preferably 0.1 or more and 0.5 or less, more preferably 0.16 or more and 0.45 or less, and the most preferably 0.2 or more and 0.4 or less. For example, when the surface acoustic wave propagation direction is less than ±5 degrees ($|α|≦5$ degrees) from an axis ([2-1-1] axis) vertical to a C-axis projection line direction of the sapphire substrate, by setting h/λ $0.2≦h/λ≦0.4$, it makes possible to obtain large $K^2$ of about 10% in case of $V≧4400$ m/s in the $LiTaO_3$ thin film and to obtain large $K^2$ of about 20% to 24% in case of V is from 5040 to 5600 m/s. Thus, V and $K^2$ significantly exceeding the respective bulk crystal properties ($LiTaO_3$: $V≦3500$ m/s and $K^2≦1\%$, $LiNbO_3$: $V≦4000$ m/s, $K^2≦5.5\%$) can be achieved.

On the other hand, the (100) $LiNbO_3$/(012) sapphire according to the present invention (forming the (100) $LiNbO_3$ film on the (012) sapphire substrate) is a novel piezoelectric substrate in which the C-axis projection line direction of the sapphire substrate and the C-axis direction of the $LiNbO_3$ film are parallel to each other. Conventionally, there has been obtained only a substrate in which the C-axis projection direction of the crystal axis of the sapphire substrate and the C-axis direction of the crystal axis of the (100) $LiNbO_3$ film are vertical to each other. A state in which these directions are parallel to each other is theoretically predicted to be very unstable, and has been regarded as being unfeasible (Fujimura et al., J. Appl. Phys., 75 (1994) 2169–2176). In the present invention, although a reason why such a theoretically unstable state was actually obtained is not clear, satisfactory results are often obtained when an intermediate layer is provided. Therefore, the presence of such an intermediate layer is considered to contribute to improved stability.

Although it is not our intention to be adhered to theory, a role of the intermediate layer in the present invention is considered to contribute to stabilization of the above mentioned specific epitaxial relationship at the initial stage of forming the (100) $LiNbO_3$ film. Thereafter, the intermediate layer is absorbed almost completely by the $LiNbO_3$ film. The thickness of the intermediate layer is properly 0.1 nm or more and 10 nm or less, preferably 0.1 nm or more and 6 nm or less, and more preferably 0.15 nm or more and less than 3 nm.

A preferred film-forming methods is, but not limited to, a pulsed laser deposition technique. For example, the intermediate layer is fabricated under high vacuum wherein $Nb_2O_5$, Nb metal, $Ta_2O_5$, Ta metal, $Al_2O_3$, Al metal or the like is employed as a target for fabricating an intermediate layer. Then, a substrate temperature is increased, an oxygen gas is introduced and then a $LiNbO_3$ film may be formed. An intermediate layer immediately before forming the $LiNbO_3$ film is often oxidized. For example, when $Nb_2O_5$ is employed as a target, Nb immediately before formation of the $LiNbO_3$ film is completely pentavalent.

Although the role of the intermediate layer has yet clarified completely, it is considered that the layer serves to homogenize a surface state of the substrate immediately before forming the film. Therefore, instead of forming such an intermediate layer, pretreatment of the sapphire substrate can be carried out to homogenize a surface chemical state of the substrate, thereby making it possible to attain an effect similar to the above.

In addition, the intermediate layer according to the present invention provides an orientation control effect. In general, when a $LiNbO_3$ film is formed directly on the (012) sapphire substrate, the (012) $LiNbO_3$ film is prone to be preferentially oriented, thus making it difficult to control orientation. When the intermediate layer according to the present invention is employed, the growth of the (012) $LiNbO_3$ film can be inhibited, thus making it possible to obtain a complete (100) $LiNbO_3$ film.

When a surface acoustic wave functional element is made of the above mentioned novel piezoelectric substrate, the surface acoustic wave propagation direction is preferably within a range of ±35 degrees around an axis ([2-1-1] axis) vertical in the C-axis projection line direction of the sapphire substrate, more preferably within a range of ±20 degrees around the axis ([2-1-1] axis) vertical to the C-axis projection line direction of the sapphire substrate, and the most preferably within a range of ±10 degrees around the axis ([2-1-1] axis) vertical to the C-axis projection line direction of the sapphire substrate.

Assuming that the film thickness of (100) LiNbO$_3$ is 'h' and a wavelength of the surface acoustic wave is $\lambda$, h/$\lambda$ is generally 0.01 or more and 2 or less, preferably 0.1 or more and 1 or less, more preferably 0.16 or more and 0.8 or less, and the most preferably 0.25 or more and 0.37 or less. When a surface acoustic wave functional element with the h/$\lambda$ less than 0.16 is formed, the surface wave becomes a Leaky wave that has a propagation loss, and thus, propagation length reduction or the like must be taken into consideration.

By setting the surface acoustic wave propagation direction to an axial direction vertical to the C-axis projection line direction of the sapphire substrate, and the h/$\lambda$ to a value from 0.16 to 0.8, it makes possible to achieve K$^2$=16.5 to 25% and about V=5800 to 4650 m/s and to significantly exceed properties of the conventional materials.

That is, according to the present invention, there can be provided a surface acoustic wave functional element and a piezoelectric substrate, both of which have an electromechanical coupling coefficient K$^2$ of 8% or more, preferably 15% or more, and more preferably 20% or more.

The present invention is related to the improvement of electromechanical coupling coefficient and a surface acoustic wave velocity by employing the above mentioned specific piezoelectric substrate. With respect to any other configuration than the above piezoelectric substrate, a structure of a conventional surface acoustic wave functional element utilizing a publicly known surface acoustic wave can be adopted as required. For example, the shape and the materials of the interdigital transducers are not limited. For example, there can be employed Al, Au, Pt, Cu, Al—Ti alloys, Al—Cu alloys, an Al and Ti multi-layered electrode or the like disclosed in the PCT Application Publication WO98/04040.

EXAMPLES

Hereinafter, the present invention will be described in more detail with the reference of specific Examples.

Example 1

Figure 6:
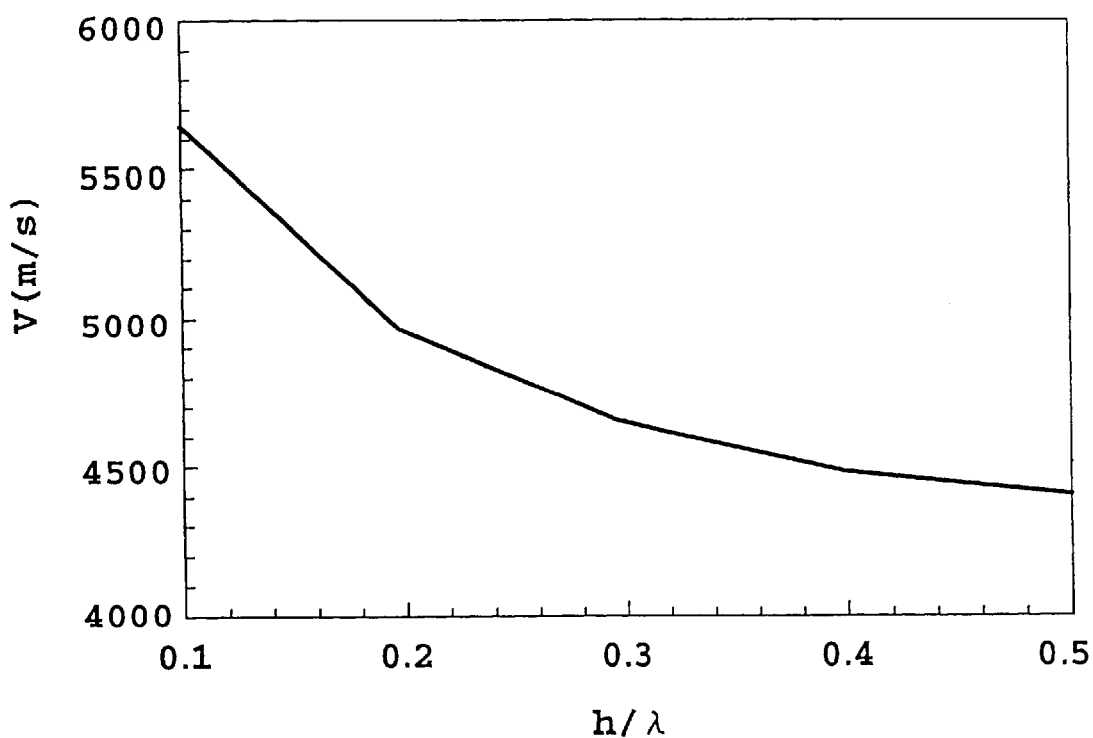
FIG. 6 is a graph depicting the measurement results of a surface acoustic wave velocity of a surface acoustic wave functional element according to Example 1.
Figure 7:
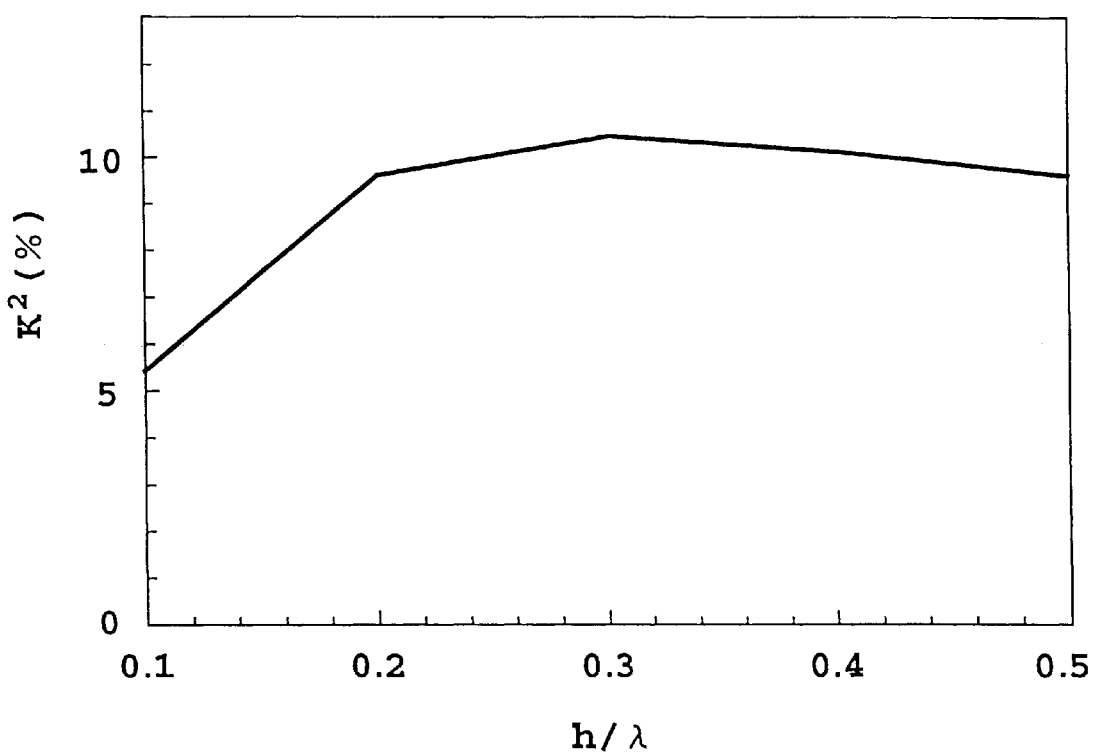
FIG. 7 is a graph depicting the measurement results of an electromechanical coupling coefficient of the surface acoustic wave functional element according to Example 1.

A (012) sapphire was employed as a substrate. A commercially available sapphire substrate was purchased, and employed without treatment except for degreasing with an organic solvent and drying. A pulsed laser deposition technique was used for synthesizing a LiTaO$_3$ film. The deposition conditions are shown below. The formation of (012) LiTaO$_3$ film was confirmed by an X-ray diffraction method. On a film having various film thickness, an Al-based input/output interdigital transducer was fabricated by a lithography process. As a transducer, a uniform transducer with 0.9 $\mu$m in pitch was used (a wavelength of the surface acoustic wave is 3.6 $\mu$m). The propagation length was 400 $\mu$m. The surface acoustic wave propagation direction was an direction of the axis ([2-1-1] axis) vertical to the C-axis projection line direction of the sapphire substrate. The electromechanical coupling coefficient and surface acoustic wave velocity was measured by a publicly known method using a network analyzer (Yokogawa Hewlett-Packard, 8510B) (Surface Acoustic Wave Engineering, P. 124–128, The Institute of Electronics, Information and Communication Engineers). The results of the measurements of the surface acoustic wave velocity and electromechanical coupling coefficient are shown in FIG. 6 and FIG. 7, respectively. In the h/$\lambda$ on a horizontal axis, 'h' designates a film thickness of the LiTaO$_3$ film, and $\lambda$ designates a wavelength of the surface acoustic wave. It can be observed that a large electromechanical coupling coefficient (about 11%) is achieved at a surface acoustic wave velocity of 4400 m/s or more.

| Deposition conditions for LiTaO$_3$ film | |
|---|---|
| Substrate temperature | 700° C. |
| Gas to be introduced | Ozone in oxygen (8% ozone) |
| Distance between target and substrate | 3.5 cm |
| Pressure | 0.5 mTorr |
| Target | Li/Ta = 2.0 |
| Laser wavelength | 193 nm (ArF excimer laser) |
| Laser output | 300 mJ |
| Laser repetition | 15 Hz |

Example 2

Figure 8:
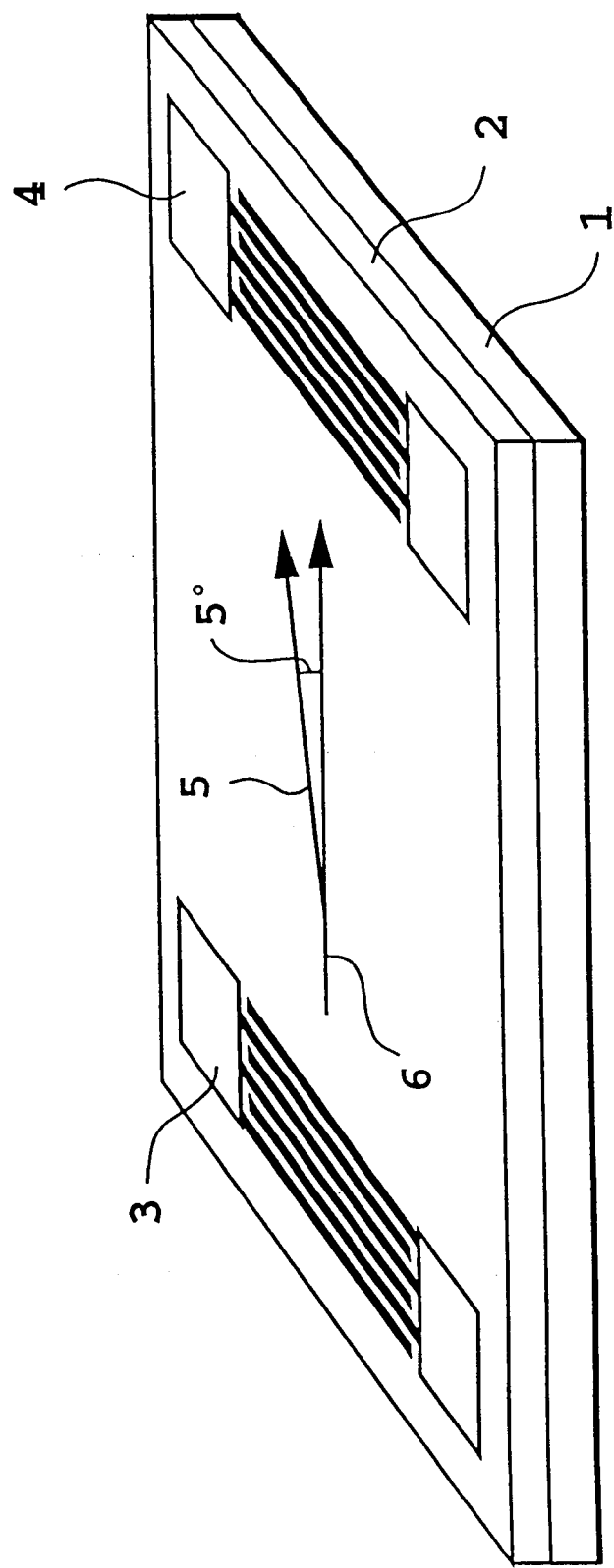
FIG. 8 is a schematic view of a surface acoustic wave functional element according to Example 2.
Figure 9:
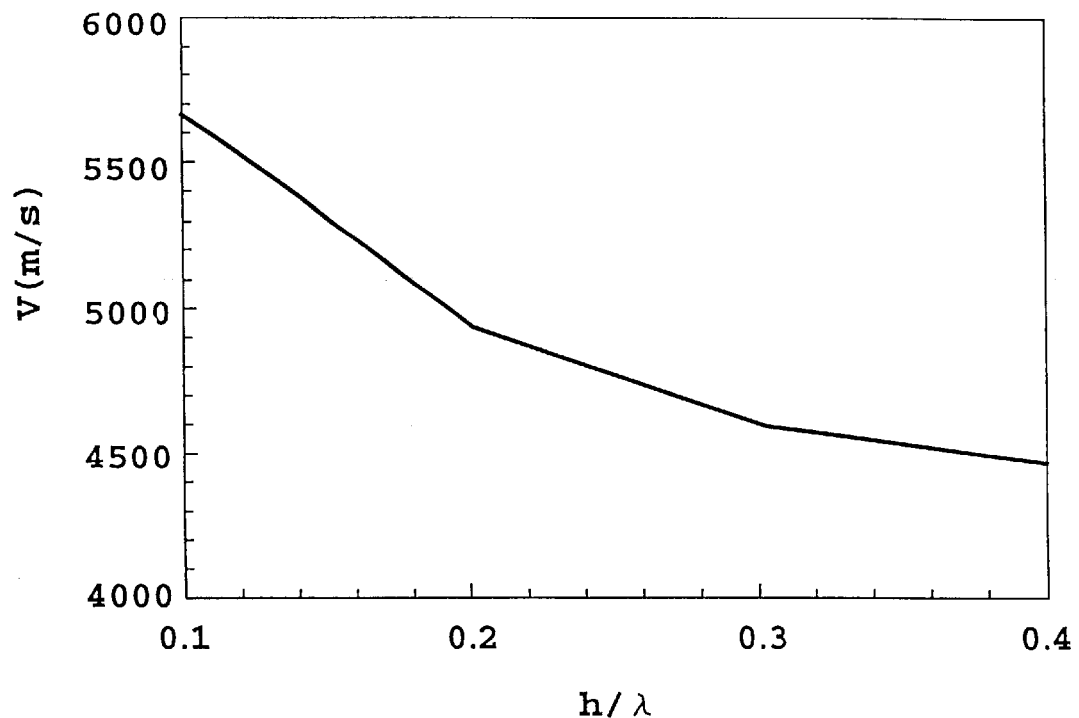
FIG. 9 is a graph depicting the measurement results of a surface acoustic wave velocity of the surface acoustic wave functional element according to Example 2.

By using a method similar to that shown in Example 1, a (012) LiTaO$_3$ film was fabricated on a (012) sapphire substrate. Then a surface acoustic wave was propagated in a direction inclined by 5 degrees from an axis ([2-1-1] axis) vertical to a C-axis projection line direction of the sapphire substrate. A schematic view of the surface acoustic wave functional element thus obtained is shown in FIG. 8. The reference numerals in FIG. 8 are the same as those in FIG. 1. The results of the measurements of surface acoustic wave velocity and electromechanical coupling coefficient of the surface acoustic wave functional element are shown in FIG. 9 and FIG. 10, respectively. It can be observed that a large electromechanical coupling coefficient (about 11%) was obtained at surface acoustic wave velocity of 4500 m/s or more.

Comparative Example 1

By using a method similar to that shown in Example 1, a (012) LiTaO$_3$ film was fabricated on a (012) sapphire substrate. Then a surface acoustic wave was propagated in a direction inclined by 90 degrees from an axis ([2-1-1] axis) vertical to a C-axis projection line direction of the sapphire substrate. In the case of h/$\lambda$=0.2, the surface acoustic wave velocity was 4400 m/s, and the electromechanical coupling coefficient was 0.05%, which indicated values substantially equal to those disclosed in the literature (Y. Shibata et al., Jpn. J. Appl. Phys. Vol 34 (1995) 249–253). Both of these values were lower than those in the surface acoustic wave functional element in Examples 1 and 2.

Example 3

Figure 11:
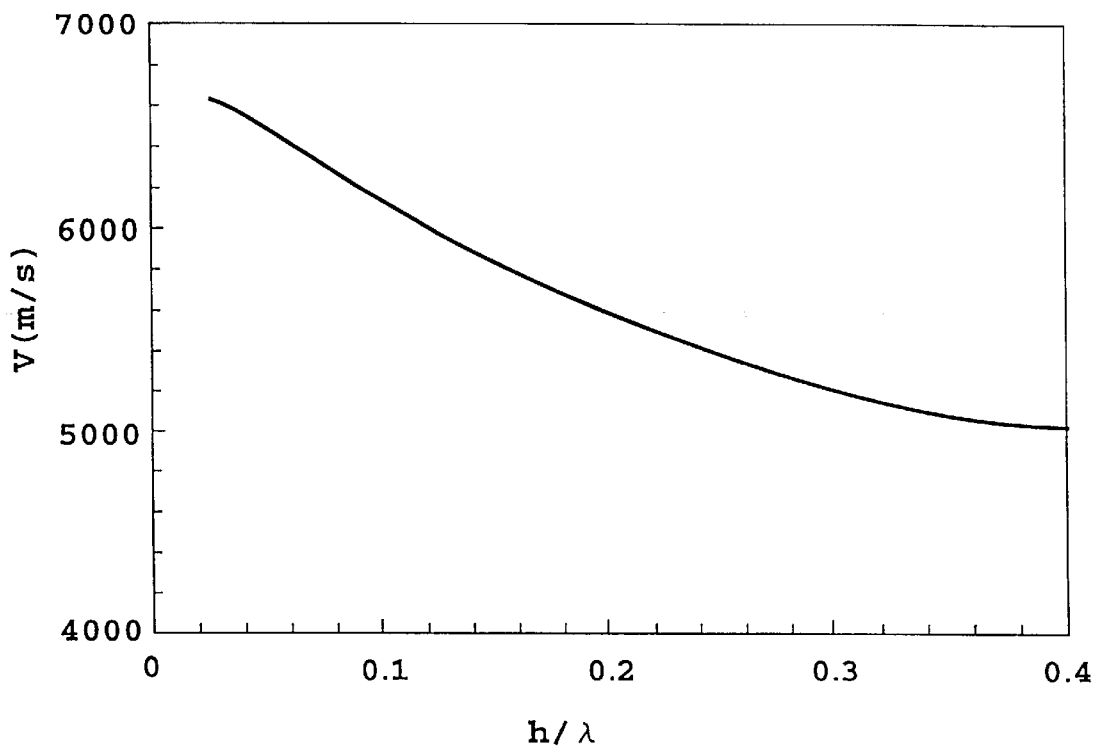
FIG. 11 is a graph depicting the measurement results of a surface acoustic wave velocity of a surface acoustic wave functional element according to Example 3.

A (012) sapphire was employed as a substrate. A commercially available sapphire substrate was purchased, degreased with an organic solvent, dried, and employed without further treatment. A pulsed laser deposition method was used for synthesizing a LiNbO$_3$ film. The deposition conditions are shown below. The formation of (012) LiNbO$_3$ film was confirmed by an X-ray diffraction method. On a film having various film thickness, an Al-based input/output interdigital transducer was fabricated by a lithography process. As a transducer, a uniform transducer with 0.9 $\mu$m in pitch was employed (a wavelength of the surface acoustic wave was 3.6 $\mu$m.) The propagation length was 400 $\mu$m. The surface acoustic wave propagation direction was an direction of an axis([2-1-1] axis) vertical to the C-axis projection line direction of the sapphire substrate. The electromechanical coupling coefficient and surface acoustic wave velocity were measured by a publicly known method using a network analyzer (Yokogawa Hewlett-Packard, 8510B) (Surface Acoustic Wave Engineering, P. 124–128, The Institute of Electronics, Information and Communication Engineers). The measurement results of the surface acoustic wave velocity and electromechanical coupling coefficient are shown in FIG. 11 and FIG. 12, respectively. In the h/λ on a horizontal axis, 'h' designates a film thickness of the LiNbO₃, and λ designates a wavelength of the surface acoustic wave. It can be observed that a large electromechanical coupling coefficient (about 24%) is achieved at a surface acoustic velocity of 4400 m/s or more.

Additionally, in the (001) LiNbO₃ film on the (001) sapphire substrate, a large electromechanical coupling coefficient is theoretically expected, however, a difference in thermal expansion coefficient between the substrate and the film was large, so that it was difficult to form a thick film and to experimentally achieve a large electromechanical coupling coefficient (Y. Shibata et al., J. Appl. Phys., 51 (1980) 2464–2470 or the like). In contrast, in the system of the present invention, a difference in thermal expansion coefficient between the substrate and the film was small, which made it possible to form a thick film and to experimentally confirm a great electromechanical coupling coefficient.

| Deposition Conditions for LiNbO₃ Film | |
|---|---|
| Substrate temperature | 700° C. |
| Gas to be introduced | Ozone in oxygen (8% ozone) |
| Distance between target and substrate | 5.5 cm |
| Pressure | 1 mTorr |
| Target | Li/Nb = 2.0 |
| Laser wavelength | 193 nm (ArF excimer laser) |
| Laser output | 300 mJ |
| Laser repetition | 15 Hz |

Comparative Example 2

By using a method similar to that shown in Example 3, a (012) LiNO₃film was formed on a (012) sapphire substrate. Then a surface acoustic wave was propagated in a direction inclined by 90 degrees from an axis ([2-1-1] axis) vertical to a C-axis projection line direction of a sapphire substrate. In the case of h/λ=0.2, the surface acoustic wave velocity was 4550 m/s, and the electromechanical coupling coefficient was 0.45%. Both of these values were lower than those in the surface acoustic wave functional element of Example 3.

Example 4

A pulsed laser deposition method was used for synthesizing an intermediate layer and a LiNbO₃ film. The deposition conditions are shown below. A commercially available sapphire substrate was purchased, degreased with an organic solvent, dried, and employed without further treatment. The thickness of the intermediate layer was set to 1 nm, and total five sample which LiNbO₃ films of various thickness was formed on the intermediate layer. As a result of evaluation of a film structure by X-ray diffraction, it was observed that (100) LiNbO₃/(012) sapphires was obtained in all of these five samples. Next, X-ray pole figure analysis was carried out by a method identical to that in the literature (Hirai et al., Jpn. J. Appl. Phys., 35 (1996) 5150–5153), and an epitaxial relationship was investigated. As a result, in all these samples, it was observed that the C-axis projection line direction of the sapphire substrate and the C-axis direction of the LiNbO₃ film were parallel to each other. The results were shown in FIG. 13.

After structural evaluation, an Al-based input/output interdigital transducer was fabricated on the film surface by a lithography process. As transducers, uniform transducers of 0.7 μm, 0.9 μm, and 1.5 μm in pitch were employed (the wavelengths of the surface acoustic wave were 2.8 μm, 3.6 μm, and 6 μm, respectively.) The propagation length was 400 μm. The surface acoustic wave propagation direction was an direction of an axis([2-1-1] axis) vertical to the C-axis projection line direction of the sapphire substrate. The electromechanical coupling coefficient and surface acoustic wave velocity were measured by a publicly known method using a network analyzer (Yokogawa Hewlett-Packard, 8510B) (Surface Acoustic Wave Engineering, P. 124–128, The Institute of Electronics, Information and Communication Engineers). The measurement results of the surface acoustic wave velocity and electromechanical coupling coefficient were shown in FIG. 14 and FIG. 15, respectively. In the h/λ on a horizontal axis, 'h' designates a film thickness of the LiNbO₃ film, and λ designates a wavelength of the surface acoustic wave. It can be observed that a large electromechanical coupling coefficient (about 25%) was achieved at a surface acoustic wave velocity of 4630 m/s or more.

| Deposition Conditions for Intermediate Layer | |
|---|---|
| Substrate temperature | No heating |
| Distance between target and substrate | 4 cm |
| Pressure | 10⁻⁸ Torr |
| Target | Nb₂O₅ |
| Laser wavelength | 193 nm (ArF excimer laser) |
| Laser output | 300 mJ |
| Laser repetition | 5 Hz |
| Synthesizing Conditions for LiNbO₃ Film | |
| Substrate Temperature | 720° C. |
| Gas to be introduced | Ozone in oxygen (8% ozone) |
| Distance between target and substrate | 4 cm |
| Pressure | 0.5 mTorr |
| Target | Li/Nb = 2.0 |
| Laser wavelength | 193 nm (ArF excimer laser) |
| Laser output | 300 mJ |
| Laser repetition | 15 Hz |

Example 5

The formation was repeated as in Example 4 except that the intermediate layer deposition conditions were changed as follows. Further, the thickness of the intermediate layer was set to 3 nm, and the layer was deposited by pulsed laser deposition technique. As a result of evaluation of a film structure by X-ray diffraction, it was observed that (100) LiNbO₃/(012) sapphires were obtained in all the films. Next, as a result of investigation of an epitaxial relationship by X-ray pole figure analysis as in Example 4, it was observed that the C-axis projection line direction of the sapphire substrate and the C-axis direction of the LiNbO₃ film were parallel to each other in all the film samples.

Figure 16:
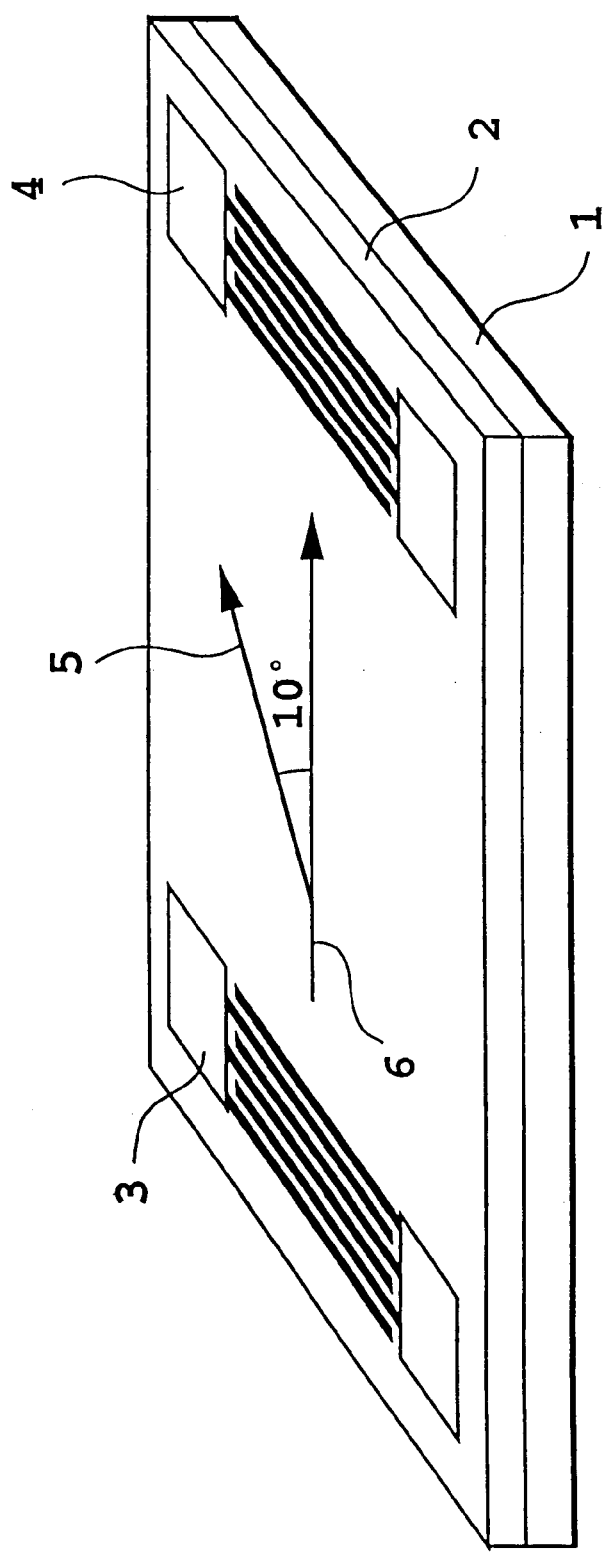
FIG. 16 is a schematic view of a surface acoustic wave functional element according to Example 5.

After structural evaluation, an Al-based interdigital transducer was fabricated on the film surface by a lithography process. The pitches and the surface acoustic wave propagation length were set in the same way as that shown in Example 4. The surface acoustic wave propagation direction was a direction inclined by 10 degrees from an axis ([2-1-1] axis) vertical to the C-axis propagation line direction of the sapphire substrate. The outlook was shown in FIG. 16.

Figure 17:
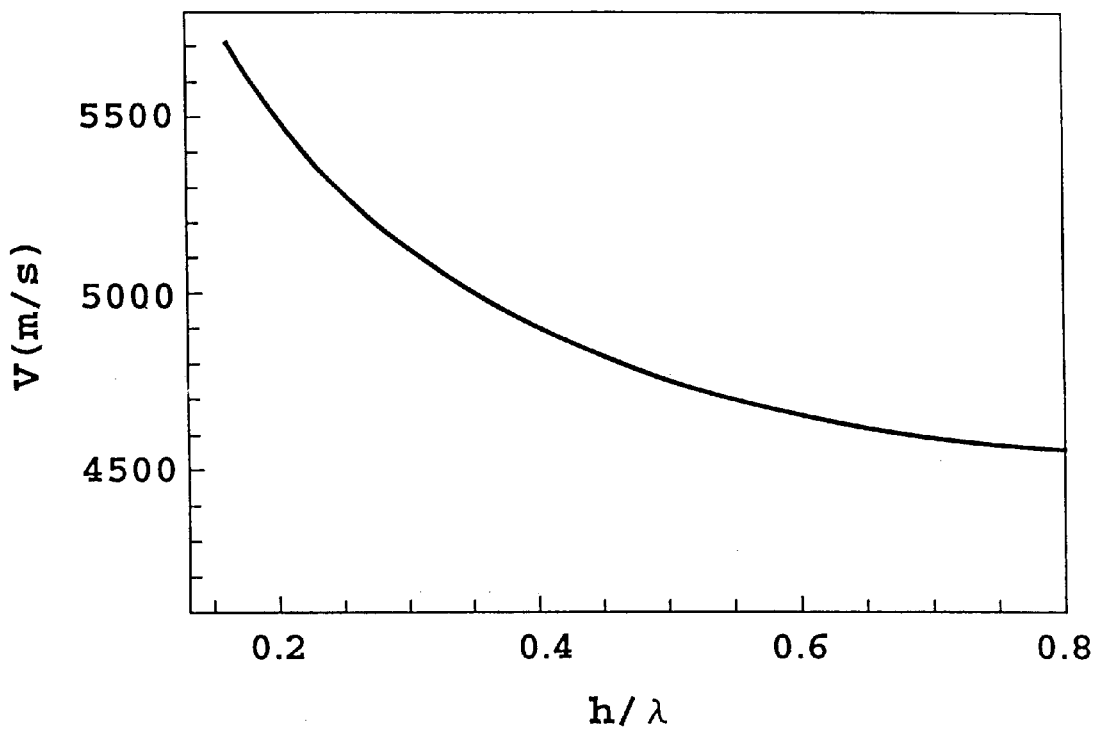
FIG. 17 is a graph depicting the measurement results of a surface acoustic wave velocity of the surface acoustic wave functional element according to Example 5.
Figure 18:
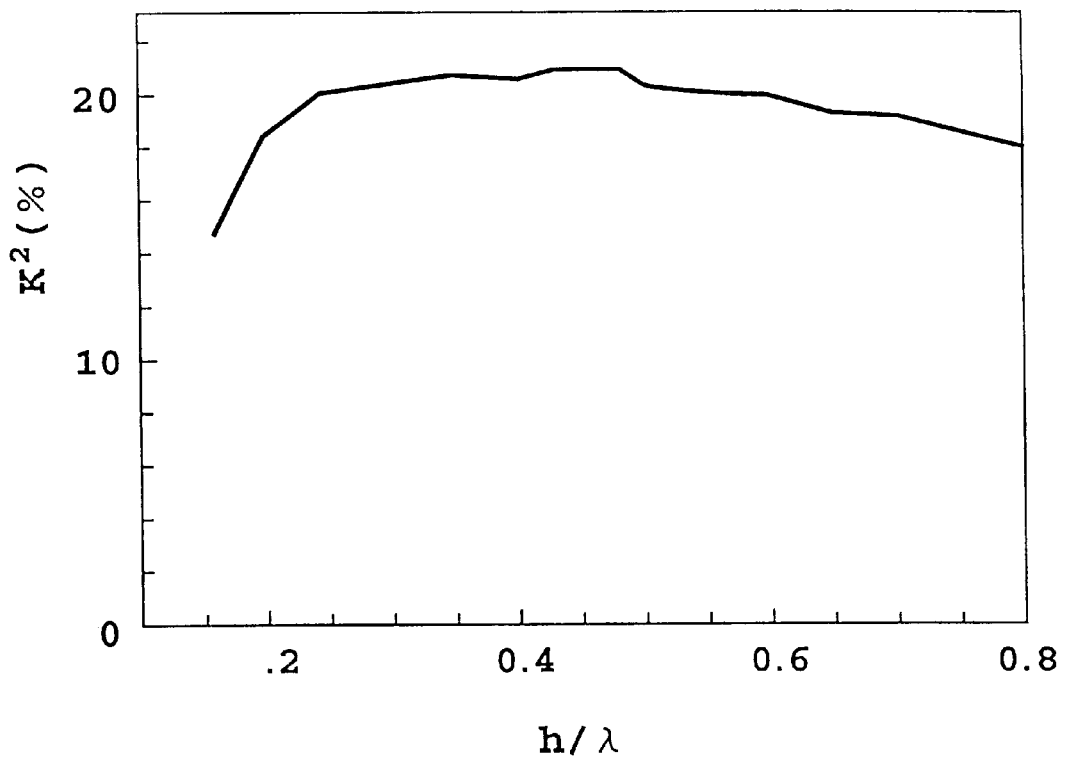
FIG. 18 is a graph depicting the measurement results of an electromechanical coupling coefficient of the surface acoustic wave functional element according to Example 5.

The surface acoustic wave velocity and electromechanical coupling coefficient were measured by a method similar to that shown in Example 4. The results are shown in FIG. 17 and FIG. 18, respectively. It is found that V and $K^2$ greater than those of the conventional materials have been achieved.

| Deposition Conditions for Intermediate Layer | |
| --- | --- |
| Substrate temperature | No heating |
| Distance between target and substrate | 4 cm |
| Pressure | $10^{-8}$ Torr |
| Target | Nb |
| Laser wavelength | 193 nm (ArF excimer laser) |
| Laser output | 300 mJ |
| Laser repetition | 5 Hz |
| Deposition Conditions for LiNbO$_3$ Film | |
| Substrate Temperature | 720° C. |
| Gas to be introduced | Ozone in oxygen (8% ozone) |
| Distance between target and substrate | 4 cm |
| Pressure | 0.5 mTorr |
| Target | Li/Nb = 2.0 |
| Laser wavelength | 193 nm (ArF excimer laser) |
| Laser output | 300 mJ |
| Laser repetition | 15 Hz |

Example 6

The formation was repeated as in Example 4 except that the intermediate layer deposition conditions were changed as follows. Further, the thickness of the intermediate layer was set to 0.15 nm, and the layer was deposited by pulsed laser deposition technique. As a result of evaluation of a film structure by X-ray diffraction, it was observed that (100) LiNbO$_3$/(012) sapphires were obtained in all the films. Next, as a result of investigation of an epitaxial relationship by X-ray pole figure analysis as in Example 4, it was observed that the C-axis projection line direction of the sapphire substrate and the C-axis direction of the LiNbO$_3$ film were parallel to each other in all the film samples.

After structural evaluation, an Al-based interdigital transducer was fabricated on the film surface by a lithography process. The pitches and the surface acoustic wave propagation length were set as in Example 4. The surface acoustic wave propagation direction was a direction inclined by 15 degrees from an axis ([2-1-1] axis) vertical to the C-axis propagation line direction of the sapphire substrate.

Figure 19:
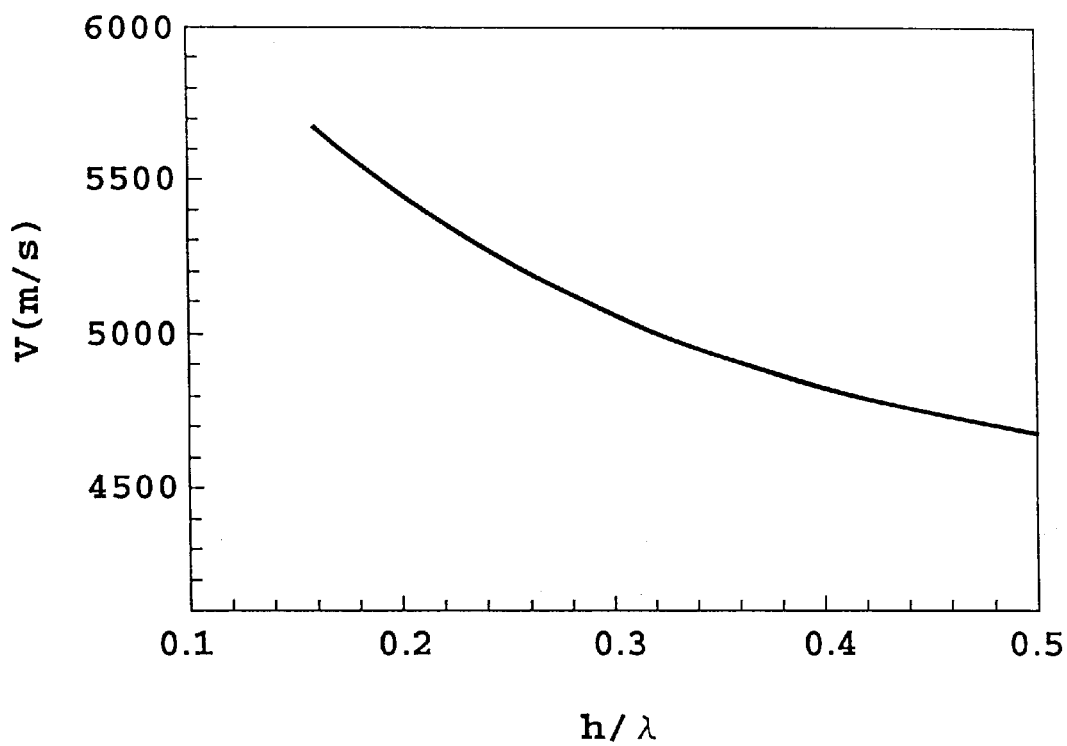
FIG. 19 is a graph depicting the measurement results of a surface acoustic wave velocity of a surface acoustic wave functional element according to Example 6.

The surface acoustic wave velocity and electromechanical coupling coefficient were measured by a method similar to that shown in Example 4. The results are shown in FIG. 19 and FIG. 20, respectively. It is found that V and $K^2$ greater than those of the conventional materials have been achieved.

| Deposition Conditions for Intermediate Layer | |
| --- | --- |
| Substrate temperature | No heating |
| Distance between target and substrate | 4 cm |
| Pressure | $10^{-8}$ Torr |
| Target | Al$_2$O$_3$ |
| Laser wavelength | 193 nm (ArF excimer laser) |
| Laser output | 300 mJ |
| Laser repetition | 5 Hz |

Example 7

The formation was repeated as in Example 4 except that the intermediate layer deposition conditions were changed as follows. Further, the thickness of the intermediate layer was set to 0.15 nm, and the layer was deposited by a high-frequency magnetron sputtering method. As a result of evaluation of a film structure by X-ray diffraction, it was observed that (100) LiNbO$_3$/(012) sapphire was obtained in all the films. Next, as a result of investigation of an epitaxial relationship by X-ray pole diagram measurement as in Example 4, it was observed that the C-axis projection line direction of the sapphire substrate and the C-axis direction of the LiNbO$_3$ film were parallel to each other in all the film samples.

After structural evaluation, an Al-based interdigital transducer was fabricated on the film surface by a lithography process. The pitches and the surface acoustic wave propagation length were set as in Example 4. The surface acoustic wave propagation direction was a direction inclined by 20 degrees from an axis ([2-1-1] axis) vertical to the C-axis propagation line direction of the sapphire substrate.

The surface acoustic wave velocity and electromechanical coupling coefficient were measured by a method similar to that shown in Example 4. The results are shown in FIG. 21 and FIG. 22, respectively. It is found that V and $K^2$ greater than those of the conventional materials have been achieved.

| Deposition Conditions for Intermediate Layer | |
| --- | --- |
| Substrate temperature | No heating |
| Distance between target and substrate | 5 cm |
| pressure | $5 \times 10^{-3}$ Torr |
| Target | Ta$_2$O$_5$ |
| Gas composition | Ar, O$_2$ (50 vol % each) |

Comparative Example 3

Five sample with LiNbO$_3$ films were fabricated under the same conditions as those shown in Example 4 without employing an intermediate layer. As a result of evaluation of the films structure by X-ray diffraction, they were observed that mixture-oriented films of (100) LiNbO$_3$ and (012) LiNbO$_3$ were obtained. Reproducibility for the films was insufficient, and the intensity ratios of the X-ray diffraction peaks of the (100) LiNbO$_3$ and (012) LiNbO$_3$ were roughly within a range of 0.1 to 10.

When the surface acoustic wave velocity and the electromechanical coupling coefficient were obtained as in Example 4, in the case of h/λ=0.2, low levels, that is, V=4300 m/s and $K^2$=0.001 or less, were obtained.

Example 8

Figure 23:
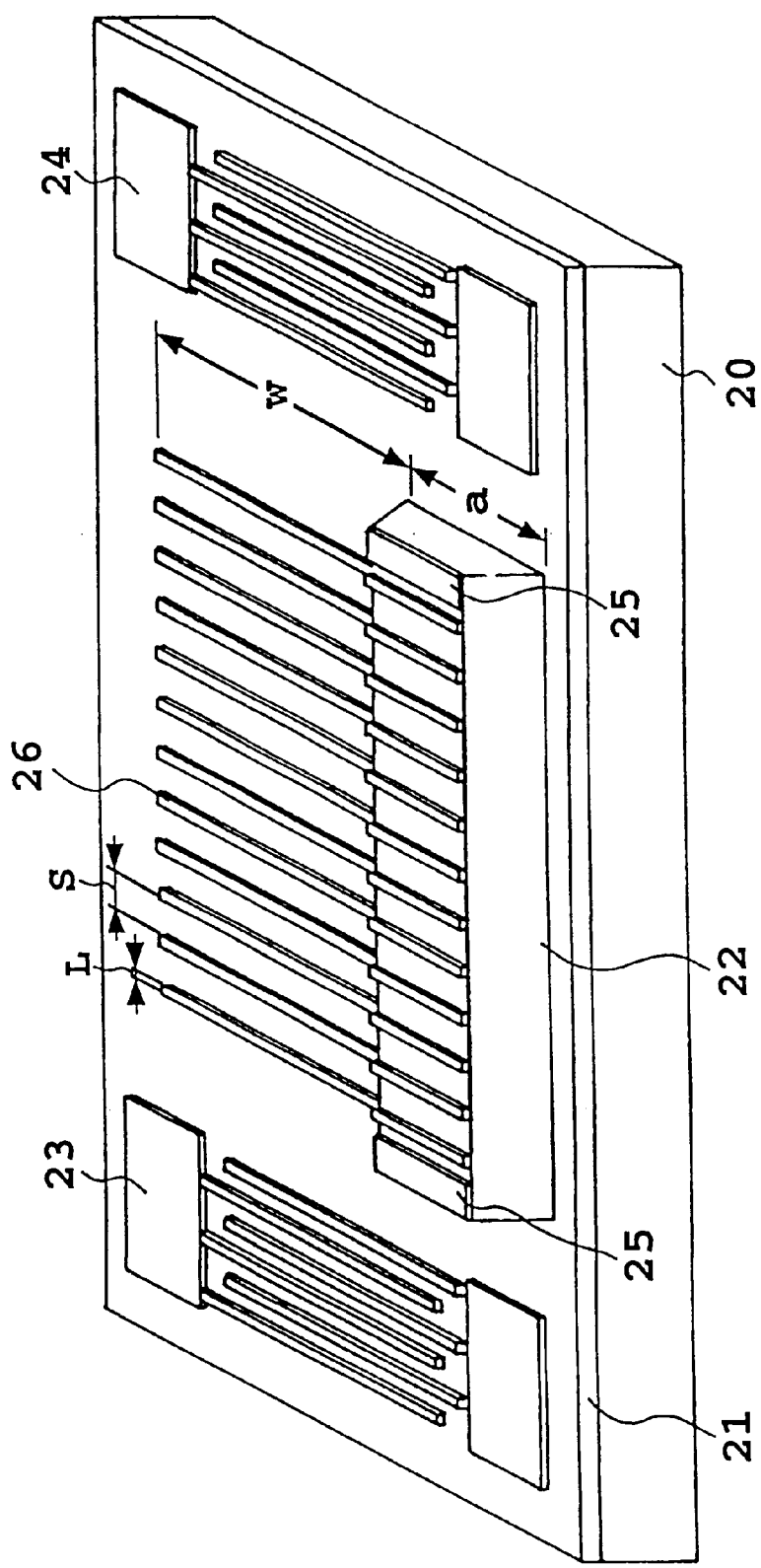
FIG. 23 is a schematic perspective view showing a surface acoustic wave (SAW) amplifier according to Example 8.

A surface acoustic wave (SAW) amplifier was fabricated as shown in FIG. 23 by employing a substrate fabricated as a piezoelectric substrate in the same way as that shown in Examples 3 and 4, respectively. Reference numeral 20 designates a (012) sapphire substrate; reference numeral 21 designates a (012) LiNbO$_3$ film or a (100) LiNbO$_3$ film; reference numeral 22 designates a semiconductor; reference numeral 23 designates an input transducer; reference numeral 24 designates an output transducer; reference numeral 25 designates an electrode; and reference numeral 26 designates a grating electrode. A surface acoustic wave propagation direction was an direction of an axis vertical to the C-axis projection line direction of the (012) sapphire substrate. On the (112) or (100) LiNbO$_3$ film 21 (film thickness of 0.6 μm) of the piezoelectric substrate, the semiconductor 22 was grown to a thickness of 550 nm using an MBE method. When electrical characteristics of the semiconductor 22 were measured at room temperature using a van der Pauw method, a carrier density $n_0=1.8\times10^{16}/cm^3$ and electron mobility $\mu=32000\ cm^2/Vs$ were obtained. Thereafter, by using photolithography technique, the semiconductor 22 was etched to a width of 'a' in a strip shape so that the semiconductor exists only outside of a propagation track (its width is designated by W) as shown in FIG. 23. Next, with a lift-off method, there were fabricated the grating electrode 26 over the surface acoustic wave propagation track and the semiconductor 22; the input interdigital transducer 23 for the surface acoustic wave; the output interdigital transducer 24, and the electrode 25 for applying a DC electric field to the semiconductor 22. In this example, the above structure was made such that a width L of the grating electrode 26 was set to 0.5 $\mu$m; a gap S between the grating electrodes was set to 0.5 $\mu$m; and a propagation track width/semiconductor layer width (W/a) was 10 (W=263 $\mu$m, a=26.3 $\mu$m). Amplification characteristics at a center frequency of about 1750 MHz when a 3V voltage was applied to the electrode 25 were measured by a network analyzer (Yokogawa Hewlett-Packard, HP-8510B), and a difference between a gain after application of the electric field and an insertion loss before application of the electric field was defined as the gain. As a result, the gain was about 31 dB, in both cases using the (012) $LiNbO_3$ film and (100) $LiNbO_3$ film. Additionally, at this time, the values of L and S were $\lambda/6$, respectively, $\lambda$ was 3 $\mu$m, and $h/\lambda$ was about 0.2. The gain of the SAW amplifier can be improved by employing a piezoelectric substrate having a large electromechanical coupling coefficient according to one Embodiment of the present invention.

Example 9

Figure 24:
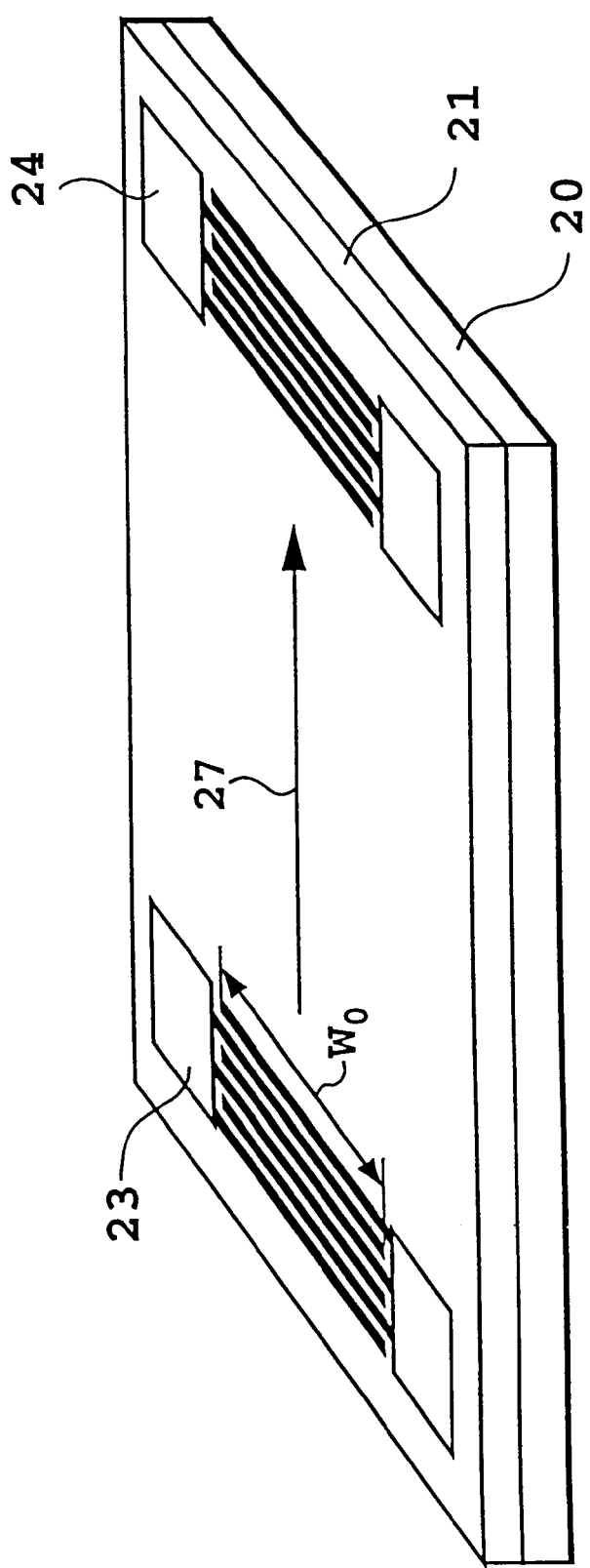
FIG. 24 is a schematic perspective view showing a surface acoustic wave filter according to Example 9.

FIG. 24 is a schematic perspective view showing a filter according to one Embodiment of the present invention. In FIG. 24, reference numeral 20 designates a (012) sapphire substrate; reference numeral 21 designates a (100) $LiNbO_3$ film; reference numeral 23 designates an input interdigital transducer; reference numeral 24 designates an output interdigital transducer; and reference numeral 27 designates a line indicative of a surface acoustic wave propagation direction. By using a method similar to that shown in Example 4, a (100) $LiNbO_3$ film 21 having 0.56 $\mu$m in thickness was formed. On this thin film, an axis ([2-1-1] axis) vertical to the C-axis projection line direction of the (012) sapphire substrate was defined as a surface acoustic wave propagation direction 27, and uniform interdigital transducers 23 and 24 were fabricated. In each of the input/output transducers 23 and 24, that was the same structure with three electrode pairs, wherein $\lambda$ was set to 2.8 $\mu$m, and an aperture width $W_0$ was set to 560 $\mu$m. The distance between the input transducer and the output transducer was set to 200 $\mu$m. The SAW characteristics of this device were measured by a network analyzer (Yokogawa Hewlett-Packard, HP-8510B). As a result, the formation of a wide bandwidth filter having a low loss in which center frequency was about 1855 MHz, a minimum insertion loss was about 8.5 dB, and a 5 dB bandwidth was 590 MHz was confirmed.

Comparative Example 4

By using a method identical to that shown in Example 9, a interdigital transducer having a same structure as that shown in Example 9 was fabricated on a 128Y-LiNbO$_3$ substrate, and the SAW characteristics were measured. As a result, the center frequency was 1387 MHz, the minimum insertion loss was about 19 dB, and the 5 dB bandwidth was 400 MHz. As compared to the filter of Example 9, although the same interdigital transducer was employed, the center frequency was lower; the insertion loss was greater; and the bandwidth was narrower. Hence, it was observed that this filter is inferior to that of the above Example in all characteristics.

INDUSTRIAL APPLICABILITY

The present invention allows to fabricate a surface acoustic wave functional element using a wave free of a propagation loss, the element having surface acoustic wave velocity of 4400 m/s or more and electromechanical coupling coefficient of about 8% or more and at most about 24%, which is superior to those of the conventional materials. Further, the present invention allows to manufacture a wide bandwidth surface acoustic wave functional element useful in a high-frequency band of 1 GHz or more, in which electrode pitches can be easily mass-produced. The present invention contributes an enormous effect in practical use of these devices.

What is claimed is:

1. A surface acoustic wave functional element comprising a (012) sapphire substrate and a $LiNb_xTa_{1-x}O_3$ film ('x' is 0 or more and 1 or less) on said (012) sapphire substrate, wherein the $LiNb_xTa_{1-x}O_3$ film is a (012) $LiNb_xTa_{1-x}O_3$ ('x' is 0 or more and 1 or less), a crystal axis of said sapphire substrate and a crystal axis of said (012) $LiNb_xTa_{1-x}O_3$ film are parallel to each other, a Love wave is propagated as a surface acoustic wave, and a propagation direction of said surface acoustic wave is in a direction perpendicular to the C-axis projection line direction of the crystal axis of said sapphire substrate or said (012) $LiNb_xTa_{1-x}O_3$ film.

2. The surface acoustic wave functional element according to claim 1, wherein $h/\lambda$ is 0.05 or more and 0.7 or less, where film thickness of said $LiNb_xTa_{1-x}O_3$ film is 'h', and a wavelength of a surface acoustic wave is $\lambda$.

3. The surface acoustic wave functional element according to claims 1 or 2, wherein said (012) $LiNb_xTa_{1-x}O_3$ film is a (012) $LiTaO_3$ film.

4. The surface acoustic wave functional element according to claims 1 or 2, wherein said (012) $LiNb_xTa_{1-x}O_3$ film is a (012) $LiNbO_3$ film.

5. A surface acoustic wave functional element comprising a (012) sapphire substrate and a $LiNb_xTa_{1-x}O_3$ film ('x' is 0 or more and 1 or less) and said (012) sapphire substrate, wherein said $LiNb_xTa_{1-x}O_3$ film is (100) $LiNb_xTa_{1-x}O_3$ ('x' is 0 or more and 1 or less); a C-axis projection line direction of a crystal axis of said sapphire substrate and a C-axis direction of a crystal axis of said (100) $LiNb_xTa_{1-x}O_3$ film are parallel to each other; a surface acoustic wave propagation direction is in a direction perpendicular to the C-axis projection line direction of the crystal axis of said sapphire substrate.

6. The surface acoustic wave functional element according to claim 5, wherein $h/\lambda$ is 0.01 or more and 2 or less, where film thickness of said $LiNb_xTa_{1-x}O_3$ film is 'h', and a wavelength of a surface acoustic wave is $\lambda$.

7. The surface acoustic wave functional element according to claim 5 or 6, wherein said (100) $LiNb_xTa_{1-x}O_3$ film is a (100) $LiTaO_3$ film.

8. The surface acoustic wave functional element according to claim 5 or 6, wherein said (100) $LiNb_xTa_{1-x}O_3$ film is a (100) $LiNbO_3$ film.

9. The surface acoustic wave functional element according to claims 1 or 5, wherein an electromechanical coupling coefficient is 8% or more.

10. A piezoelectric substrate useful for a surface acoustic wave functional element comprising a (012) sapphire substrate and a (100) $LiNb_xTa_{1-x}O_3$ film ('x' is 0 or more and 1 or less) on said (012) sapphire substrate, wherein a C-axis projection line direction of a crystal axis of said sapphire substrate and a C-axis direction of a crystal axis of said (100) $LiNb_xTa_{1-x}O_3$ film are parallel to each other and wherein the surface acoustic wave propagation is in a direction perpendicular to the C-axis projection line direction.

11. The piezoelectric substrate useful for a surface acoustic wave functional element according to claim 10, further comprising an intermediate layer comprised of a metal oxide between said sapphire substrate and said (100) $LiNb_xTa_{1-x}O_3$ film, wherein said intermediate layer is present throughout a surface acoustic wave propagation area.

12. The piezoelectric substrate useful for a surface acoustic wave functional element according to claim 11, wherein a thickness of said intermediate layer is 0.1 nm or more and 10 nm or less.

13. The piezoelectric substrate useful for a surface acoustic wave functional element according to claim 11, wherein said intermediate layer comprises at least one selected from a group consisting of oxide of niobium, tantalum, and aluminum.

14. The piezoelectric substrate useful for a surface acoustic wave functional element according to any one of claims 10 to 13, wherein said (100) $LiNb_xTa_{1-x}O_3$ film is a $LiNbO_3$ film.

15. The piezoelectric substrate useful for a surface acoustic wave functional element according to claim 10, wherein an electromechanical coupling coefficient is 8% or more.

* * * * *